(12) United States Patent
Masuda et al.

(10) Patent No.: US 11,367,572 B2
(45) Date of Patent: Jun. 21, 2022

(54) CONDUCTIVE TERMINAL AND ELECTRONIC DEVICE

(71) Applicant: TDK CORPORATION, Tokyo (JP)

(72) Inventors: Akihiro Masuda, Tokyo (JP); Norihisa Ando, Tokyo (JP); Shinya Ito, Tokyo (JP); Kosuke Yazawa, Tokyo (JP); Yoshiki Satou, Tokyo (JP); Katsumi Kobayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/988,819

(22) Filed: Aug. 10, 2020

(65) Prior Publication Data

US 2021/0043382 A1 Feb. 11, 2021

(30) Foreign Application Priority Data

Aug. 8, 2019 (JP) .............................. JP2019-146407

(51) Int. Cl.
*H01G 4/228* (2006.01)
*H01G 4/224* (2006.01)
*H01G 4/38* (2006.01)
*H01G 2/02* (2006.01)
*H01G 4/30* (2006.01)

(52) U.S. Cl.
CPC .............. *H01G 4/228* (2013.01); *H01G 2/02* (2013.01); *H01G 4/224* (2013.01); *H01G 4/30* (2013.01); *H01G 4/38* (2013.01)

(58) Field of Classification Search
CPC ........... H01G 4/232; H01G 4/228; H01G 4/30
See application file for complete search history.

(56) References Cited

U.S. PATENT DOCUMENTS

| 2016/0260546 A1* | 9/2016 | Mori | H01G 4/12 |
| 2018/0182553 A1* | 6/2018 | Yazawa | H01G 4/30 |
| 2018/0286584 A1* | 10/2018 | Ando | H01G 4/1227 |

FOREIGN PATENT DOCUMENTS

| CN | 105938758 A | | 9/2016 |
| JP | S63-042506 A | | 2/1988 |
| JP | 04075310 A | * | 3/1992 |
| JP | H11-102837 A | | 4/1999 |
| JP | 2000-235931 A | | 8/2000 |
| JP | 2002043166 A | * | 2/2002 |
| JP | 2011040684 A | * | 2/2011 |

* cited by examiner

*Primary Examiner* — Eric W Thomas
(74) *Attorney, Agent, or Firm* — Oliff PLC

(57) ABSTRACT

A conductive terminal includes an inner electrode part, an opening edge electrode part, and a lateral electrode part. The inner electrode part is connectable to a terminal electrode of a chip component by being inserted along an inner wall of an accommodation recess of a case. The opening edge electrode part is formed continuously to the inner electrode part. The lateral electrode part is formed continuously to the opening edge electrode part along an outer surface of the case. The inner electrode part includes a base part, a curved part, and a continuous boundary part. The base part continues to the opening edge electrode part. The curved part is formed near a tip of the base part and protrudes away from the lateral electrode part. The continuous boundary part is formed between the base part and the curved part and continuously connects them.

14 Claims, 29 Drawing Sheets

CONDUCTIVE TERMINAL AND ELECTRONIC DEVICE

BACKGROUND OF THE INVENTION

The present invention relates to an electronic device including a case for accommodating a chip component, such as a multilayer ceramic capacitor, and to a conductive terminal used for the electronic device.

As an electronic device such as a multilayer ceramic capacitor, in addition to a normal chip component that is independently directly mounted on a substrate or so, known is an electronic device in which a metal cap (metal terminal) is attached to multiple chip components as shown in Patent Document 1.

It is reported that, after mounting, the electronic device to which the metal terminal is attached reduces a deformation stress in which the chip components receive from the substrate and demonstrates an effect of protecting the chip components from impacts or so, and such an electronic device is used in the fields requiring durability and reliability.

In the conventional electronic devices, however, it is not easy to connect the chip components with the metal terminal at the same time.

Patent Document 1: JPH11102837 (A)

BRIEF SUMMARY OF INVENTION

The present invention has been achieved under such circumstances. It is an object of the invention to provide an electronic device capable of extremely easily connecting a chip component with a conductive terminal, such as metal terminal, and to a conductive terminal advantageously used for the electronic device.

To achieve the above object, a conductive terminal according to the present invention includes:
an inner electrode part connectable to a terminal electrode of a chip component by being inserted along an inner wall of an accommodation recess of a case for accommodating the chip component on which the terminal electrode is formed;
an opening edge electrode part formed continuously to the inner electrode part along an opening edge surface of the case; and
a lateral electrode part formed continuously to the opening edge electrode part along an outer surface of the case,
wherein the inner electrode part includes:
a base part having a flat plate shape and continuing to the opening edge electrode part;
a curved part formed near a tip of the base part and protruding away from the lateral electrode part, and
a continuous boundary part formed in a boundary part between the base part and the curved part and continuously connecting the base part and the curved part.

The conductive terminal according to the present invention includes the inner electrode part, the opening edge electrode part, and the lateral electrode part. Thus, the terminal electrode according to the present invention can easily be attached into the accommodation recess of the case.

When the electronic device is assembled, the inner electrode part of the conductive terminal can be connected to the terminal electrode of the chip component only by accommodating the chip component into the accommodation recess via the opening surface formed on only one surface of the case. The chip components can be connected in parallel or series by connecting the inner connecting part of the conductive terminal for each of the terminal electrodes of the chip components.

Since the opening edge electrode part and the lateral electrode part of the conductive terminal are drawn out of the case, a through hole does not need to be disposed on a wall surface constituting the accommodation recess of the case. Thus, the accommodation recess of the case can also be used as a filling space of resin.

The opening edge electrode part or the lateral electrode part exposed outside the case can be used as an electrode surface for mounting. In particular, when the lateral electrode part is used as an electrode surface for mounting, it is possible to improve the strength of fixing the electronic device to a circuit board (external circuit). When a gap is formed between the lateral electrode part and a lateral wall outer surface of the case, the resonance of the electronic device can be reduced easily.

In addition, since the opening edge electrode part and the lateral electrode part of the conductive terminal are drawn out of the case, the conductive terminals of the multiple electronic devices can be connected to each other by overlapping the cases of the electronic devices. Furthermore, the conductive terminals of the different cases can be connected to each other by arranging the cases of the electronic devices side by side. That is, the degree of freedom for mounting the electronic devices is improved.

In the conductive terminal according to the present invention, since the curved part is formed in the inner electrode part, the inner electrode part and the terminal electrode of the chip component are connected in a pressure contact state by a spring force of the curved part and do not need to be connected by a connection member of solder, conductive adhesive, or the like. Since the terminal and the electrode can be connected without using solder, copper, copper alloy, etc. can be used as the material of the terminal, and equivalent series resistance (ESR) can be reduced. Since no solder is used, it is possible to reduce the risk of cracks occurring in the chip component due to difference in thermal expansion.

Preferably, a first radius of curvature (R1) of the continuous boundary part is 0.5-15 mm, a height (h) from an inner surface of the base part to a maximum protrusion position of the curved part is 0.48-0.6 mm, and the inner electrode part has a length (z) of 4.0-6.0 mm.

This structure appropriately maintains a spring force of the curved part and makes it possible to reduce a stress acting on the conductive terminal. As a result, the inner electrode part of the conductive terminal and the terminal electrode of the chip component are connected in a pressure contact state by the spring force of the curved part, and the durability of the conductive terminal is improved.

Preferably, the first radius of curvature (R1) is 3.0-10 mm. This structure further appropriately maintains a spring force of the curved part and makes it possible to further reduce a stress acting on the conductive terminal. As a result, the inner electrode part of the conductive terminal and the terminal electrode of the chip component are connected in a pressure contact state by the spring force of the curved part, and the durability of the conductive terminal is improved.

Preferably, the curved part is curved on the other side of a curve by the first radius of curvature (R1), and a second radius of curvature (R2) of the curved part is 1.0-6.0 mm. This structure further appropriately maintains a spring force of the curved part and makes it possible to further reduce a stress acting on the conductive terminal. As a result, the inner electrode part of the conductive terminal and the terminal electrode of the chip component are connected in a pressure contact state by the spring force of the curved part, and the durability of the conductive terminal is improved.

Preferably, the second radius of curvature (R2) is 2.0-5.0 mm. This structure further appropriately maintains a spring force of the curved part and makes it possible to further reduce a stress acting on the conductive terminal. As a result, the inner electrode part of the conductive terminal and the terminal electrode of the chip component are connected in a pressure contact state by the spring force of the curved part, and the durability of the conductive terminal is improved.

Preferably, a thickness (t) of the inner electrode part is 0.05-0.35 mm, and a width (w) of the inner electrode part is 1.8-2.5 mm. This structure further appropriately maintains a spring force of the curved part and makes it possible to further reduce a stress acting on the conductive terminal. As a result, the inner electrode part of the conductive terminal and the terminal electrode of the chip component are connected in a pressure contact state by the spring force of the curved part, and the durability of the conductive terminal is improved.

Preferably, the thickness (t) of the inner electrode part is 0.1-0.35 mm. This structure further appropriately maintains a spring force of the curved part and makes it possible to further reduce a stress acting on the conductive terminal. As a result, the inner electrode part of the conductive terminal and the terminal electrode of the chip component are connected in a pressure contact state by the spring force of the curved part, and the durability of the conductive terminal is improved.

A through hole may be formed in the base part of the inner electrode part. When the opening edge electrode part or the lateral electrode part is connected to the circuit board with solder, solder rising toward the inner electrode part can be prevented by the through hole. That is, so-called solder bridges can be prevented effectively.

An engagement piece protruding outward in a width direction may be formed with the base part of the inner electrode part. In this structure, when the inner electrode part of the conductive terminal is only inserted into the case, the engagement piece is engaged with the case in a one-touch manner, and the terminal can be easily positioned and firmly fixed to the case.

A surface of the inner electrode part may be subjected to a solder adhesion prevention treatment. This structure can prevent so-called solder bridges effectively.

To achieve the above object, an electronic device according to the present invention includes:
  any of the above-mentioned conductive terminal,
  a chip component on which a terminal electrode is formed, and
  a case having an accommodation recess for accommodating the chip component and an opening edge surface along an opening surface of the accommodation recess.

When the electronic device according to the present invention is assembled, the inner electrode part of the conductive terminal can be connected to the terminal electrode of the chip component only by accommodating the chip component into the accommodation recess via the opening surface formed on only one surface of the case. The chip components can be connected in parallel or series by connecting the inner connecting part of the conductive terminal for each of the terminal electrodes of the chip components.

In the electronic device according to the present invention, since the chip component is accommodated in the accommodation recess of the chip component, the chip component is protected by the case, and the reliability of the electronic device is improved. Furthermore, the opening edge electrode part and the lateral electrode part of the conductive terminal are drawn out of the case, and a through hole does not need to be disposed on a wall surface constituting the accommodation recess of the case. Thus, the accommodation recess of the case can also be used as a filling space of resin.

The opening edge electrode part or the lateral electrode part exposed outside the case can be used as an electrode surface for mounting. In particular, when the lateral electrode part is used as an electrode surface for mounting, it is possible to improve the strength of fixing the electronic device to a circuit board (external circuit). When a gap is formed between the lateral electrode part and the lateral wall outer surface of the case, the resonance of the electronic device can be reduced easily.

In addition, since the opening edge electrode part and the lateral electrode part of the conductive terminal are drawn out of the case, the conductive terminals of the multiple electronic devices can be connected to each other by overlapping the cases of the electronic devices. Furthermore, the conductive terminals of the different cases can be connected to each other by arranging the cases of the electronic devices side by side. That is, the degree of freedom for mounting the electronic devices is improved. The electronic device according to the present invention is comparatively compact.

DETAILED DESCRIPTION OF INVENTION

Hereinafter, the present invention is explained based on the embodiments shown in the figures.

First Embodiment

Figure 1:
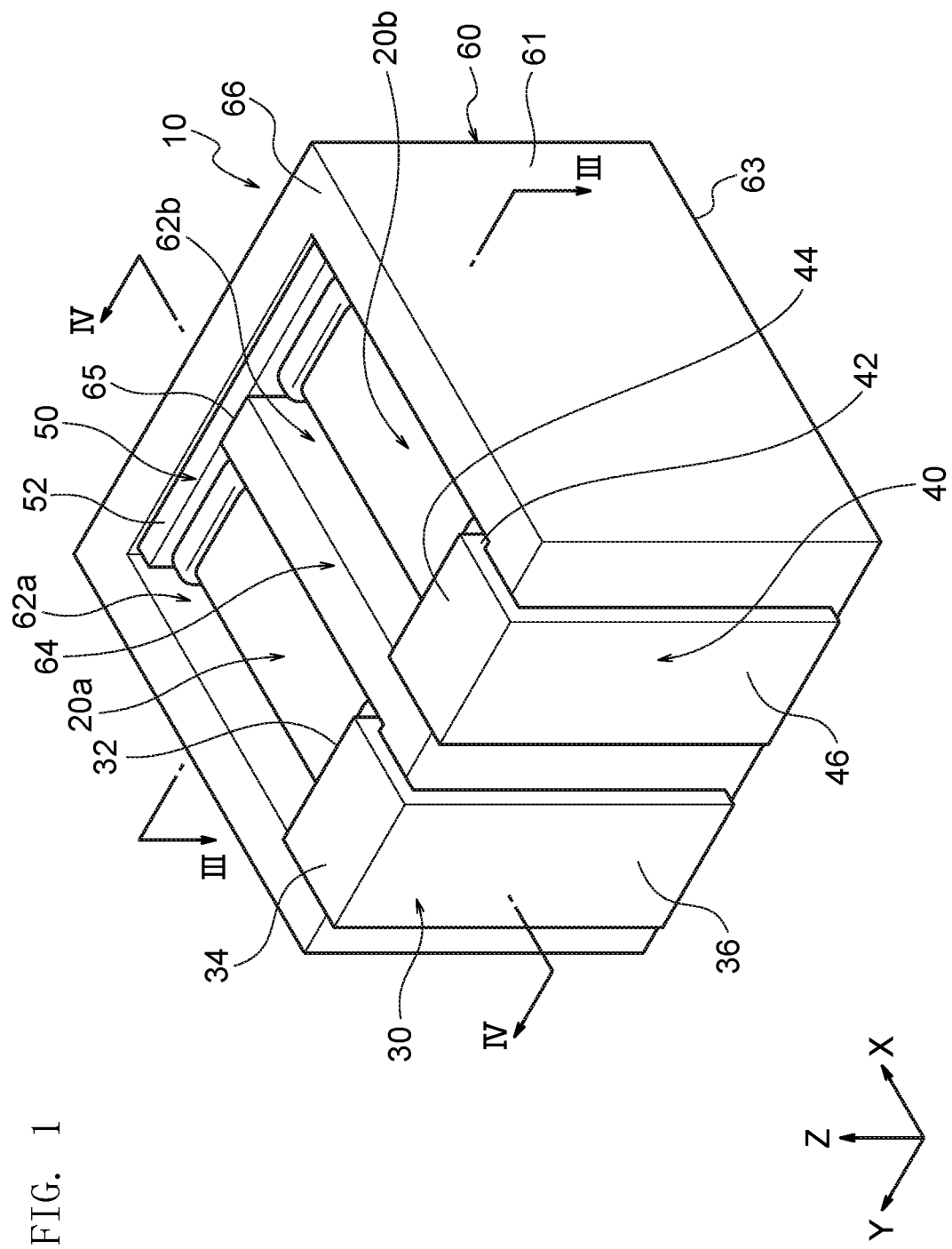
FIG. 1 is a schematic perspective view of an electronic device attached with metal terminals according to an embodiment of the present invention.
Figure 2A:
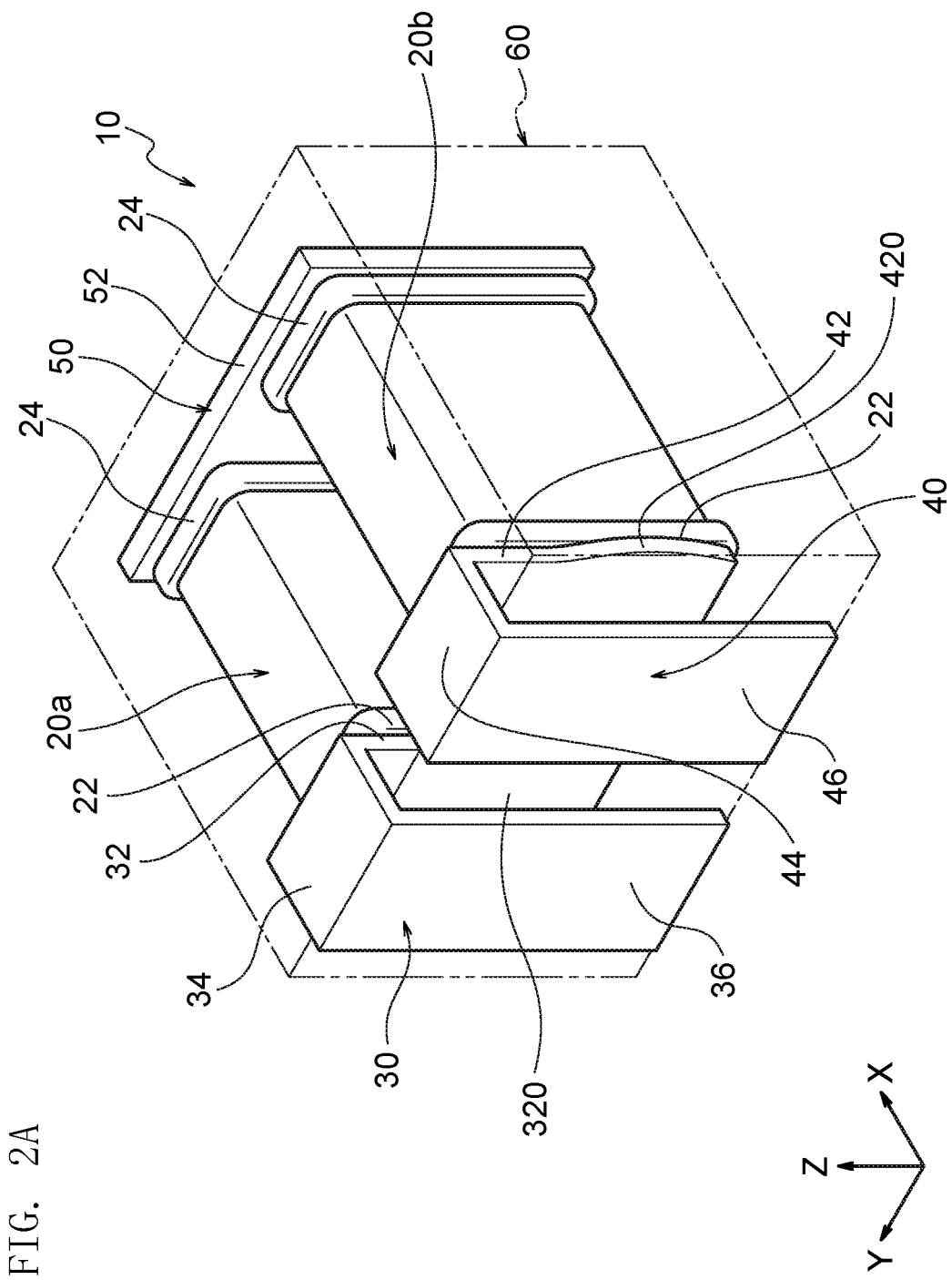
FIG. 2A is a schematic perspective view of the inside of the electronic device with a transparent case of FIG. 1.

As shown in FIG. 1 and FIG. 2A, an electronic device 10 according to First Embodiment of the present invention includes two capacitor chips (chip components) 20a and 20b, a pair of individual metal terminals (individual conductive terminals) 30 and 40, a common metal terminal (common conductive terminal) 50, and an insulating case 60. Incidentally, the individual metal terminals 30 and 40 and the common metal terminal 50 may be formed of conductive terminals made of a conductive material other than metal.

Figure 3:
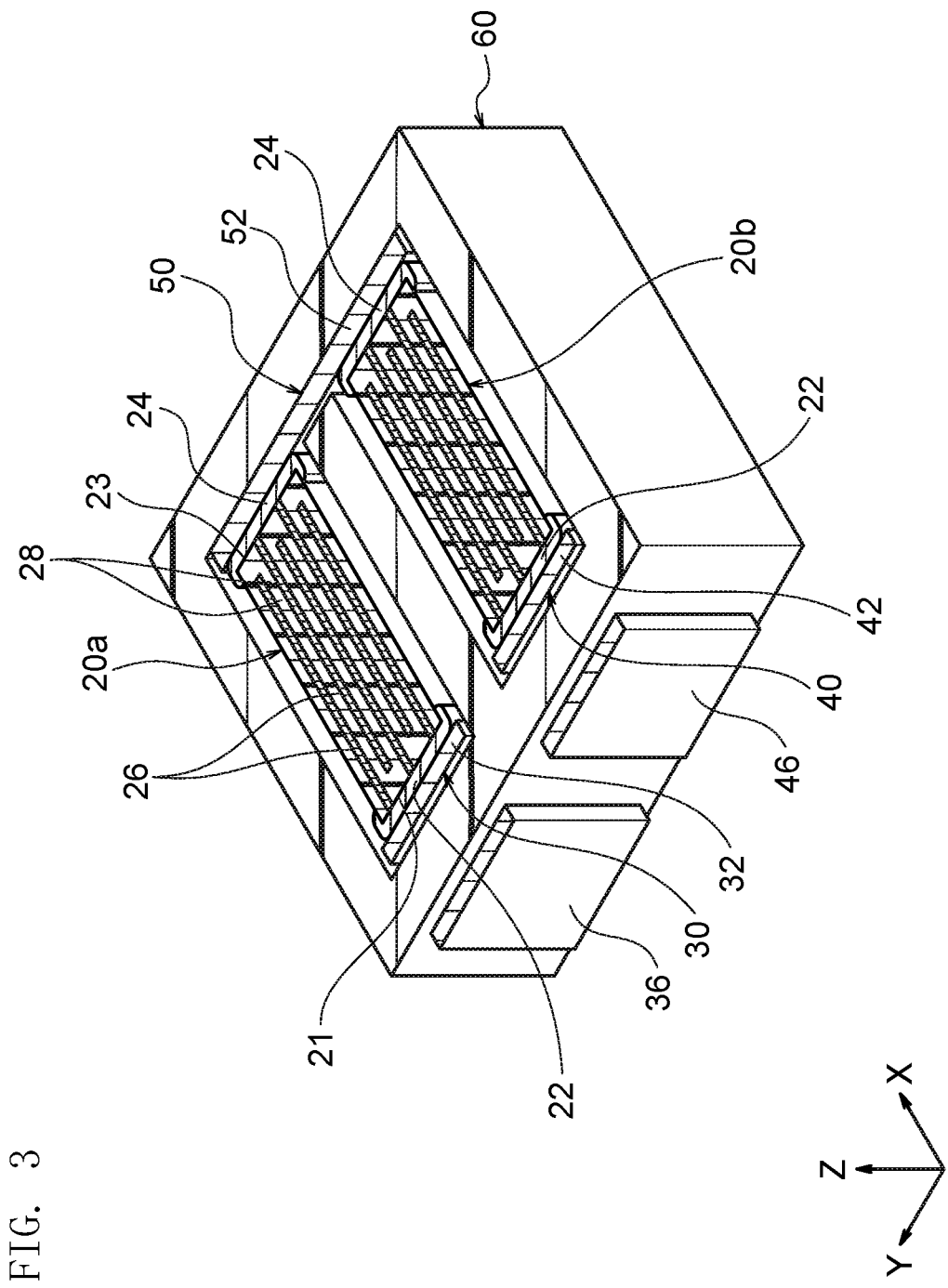
FIG. 3 is a cross-sectional view of the electronic device along the line III-III shown in FIG. 1.

As shown in FIG. 2A, each of the capacitor chips 20a and 20b has a substantially rectangular parallelepiped shape, and the capacitor chips 20a and 20b have substantially the same shape and size. As shown in FIG. 3, each of the capacitor chips 20a and 20b has an element body in which internal electrode layers 26 and dielectric layers 28 are laminated along the Y-axis direction, and first and second terminal electrodes 22 and 24 are respectively formed on first and second end surfaces 21 and 23 of the element body facing each other in the X-axis direction (longitudinal direction) and are connected to any of the internal electrode layers 26 next to each other in the laminated direction.

The dielectric layers 28 of the capacitor chips 20a and 20b are made of any material, such as a dielectric material of calcium titanate, strontium titanate, barium titanate, and these mixture. Each of the dielectric layers 28 has any thickness, but normally has a thickness of 1 μm to several hundreds μm. In the present embodiment, preferably, each of the dielectric layers 28 has a thickness of 1.0-5.0 μm.

The conductor material contained in the internal electrode layers 26 is not limited, but can be a comparatively inexpensive base metal when the dielectric layers 28 are made of a reduction resistant material. Preferably, the base metal is Ni or a Ni alloy. Preferably, the Ni alloy is an alloy of Ni and one or more elements selected from Mn, Cr, Co, and Al. Preferably, the Ni content of the alloy is 95 wt % or more. Incidentally, various fine components, such as P, may be contained in Ni or the Ni alloy by about 0.1 wt % or less. The internal electrode layers 26 may be formed using a commercially available electrode paste. The thickness of each of the internal electrode layers 26 is appropriately determined based on usage or so.

The first and second terminal electrodes 22 and 24 are also made of any material and are normally made of copper, copper alloy, nickel, nickel alloy, or the like, but can also be made of silver, silver-palladium alloy, or the like. Each of the terminal electrodes 22 and 24 also has any thickness, but normally has a thickness of about 10-50 μm. Incidentally, at least one type of metal film selected from Ni, Cu, Sn, etc. may be formed on the surfaces of the first and second terminal electrodes 22 and 24.

The shape and size of the capacitor chips 20a and 20b may appropriately be determined based on purpose and application. For example, each of the capacitor chips 20a and 20b has a length of 1.0-6.5 mm (length in the X-axis direction shown in FIG. 2A), a width of 0.5-5.5 mm (a width in the Z-axis dimension shown in FIG. 2A), and a thickness of 0.3-3.5 mm (a thickness in the Y-axis dimension shown in FIG. 2A). The capacitor chips 20a and 20b may have different sizes and shapes. In the figures, the X-axis, the Y-axis, and the Z-axis are perpendicular to each other.

Figure 2B:
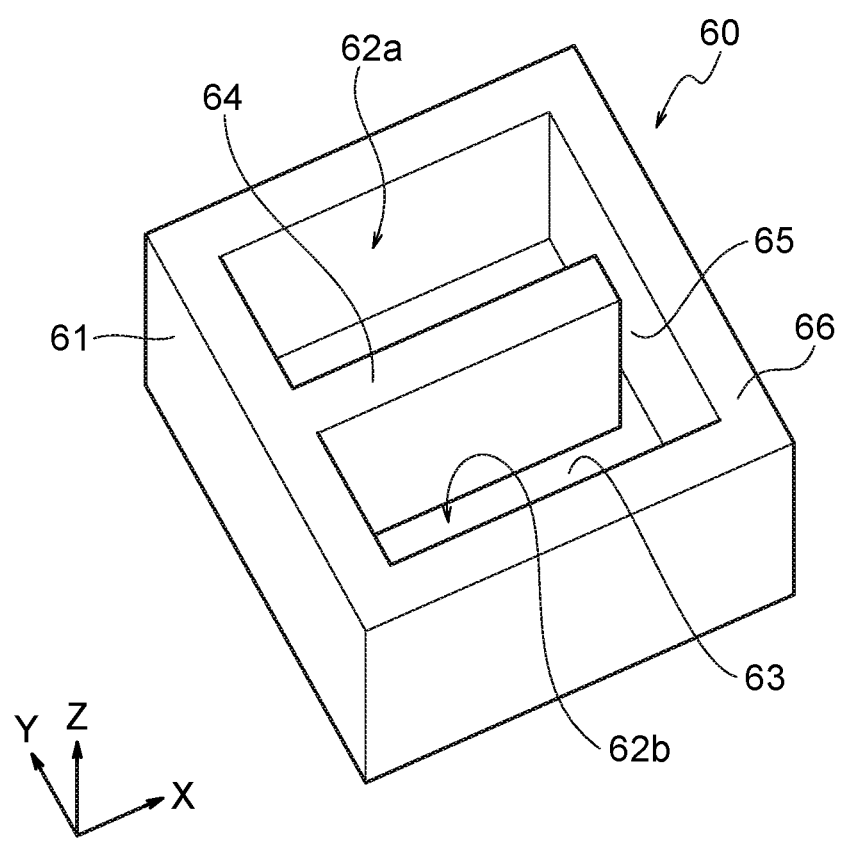
FIG. 2B is a schematic perspective view of the case shown in FIG. 1 viewed from a different angle.

In the present embodiment, as shown in FIG. 1 and FIG. 2B, the insulating case 60 is formed by a rectangular parallelepiped housing and has an outer wall 61 and a bottom wall 63 both surrounding multiple accommodation recesses 62a and 62b opening upward in the Z-axis direction. The accommodation recesses 62a and 62b next to each other in the Y-axis direction are mostly divided by a partition wall 64, but are communicated with each other via a communication groove 65 formed in the partition wall 64.

The communication groove 65 is formed along inner wall surfaces of the accommodation recesses 62a and 62b on one side in the X-axis direction. Through the communication groove 65, an inner electrode part 52 of the common metal terminal 50 is attached in the accommodation recesses 62a and 62b along the inner wall surfaces so as to bridge the accommodation recesses 62a and 62b.

In the present embodiment, the width of the communication groove 65 in the X-axis direction is a width in which the inner electrode part 52 of the common metal terminal 50 can be inserted and fixed, and the depth of the communication groove 65 in the Z-axis direction is approximately the same as that of each of the accommodation recesses 62a and 62b in the Z-axis direction. In the present embodiment, the common metal terminal 50 is configured by only the inner electrode part 52 to be inserted into the accommodation recesses 62a and 62b through the communication groove 65, and the inner electrode part 52 is formed from a rectangular flat plate. As shown in FIG. 2A, the inner electrode part 52 is in contact with and electrically connected to both of the second terminal electrodes 24 and 24 of the capacitor chips 20a and 20b.

In the present embodiment, as shown in FIG. 2B, the opening surfaces of the accommodation recesses 62a and 62b of the insulating case 60 are only the upper surfaces in the Z-axis direction, and none of hole, notch, groove, and opening communicated with the outside of the case 60 is formed on the outer wall 61 or the bottom wall 63 of the accommodation recesses 62a and 62b. The case 60 includes an opening edge surface 66 located around the opening surfaces of the accommodation recesses 62a and 62b of the insulating case 60 on the upper surface of the outer wall 61 in the Z-axis direction. In the present embodiment, the opening edge surface 66 is flush with the upper surface of the partition wall 64 in the Z-axis direction, but may not be flush with the upper surface of the partition wall 64 in the Z-axis direction.

As shown in FIG. 1 and FIG. 2A, the first individual metal terminal 30 includes an inner electrode part 32 to be inserted along the other inner wall in the X-axis direction of the accommodation recess 62a (one accommodation recess) of the insulating case 60. As shown in FIG. 3, the inner electrode part 32 is contacted and electrically connected to the first terminal electrode 22 of the capacitor chip 20a (one capacitor chip in the Y-axis direction). An opening edge electrode part 34 is formed continuously to the inner electrode part 32 along the opening edge surface 66.

Figure 4:
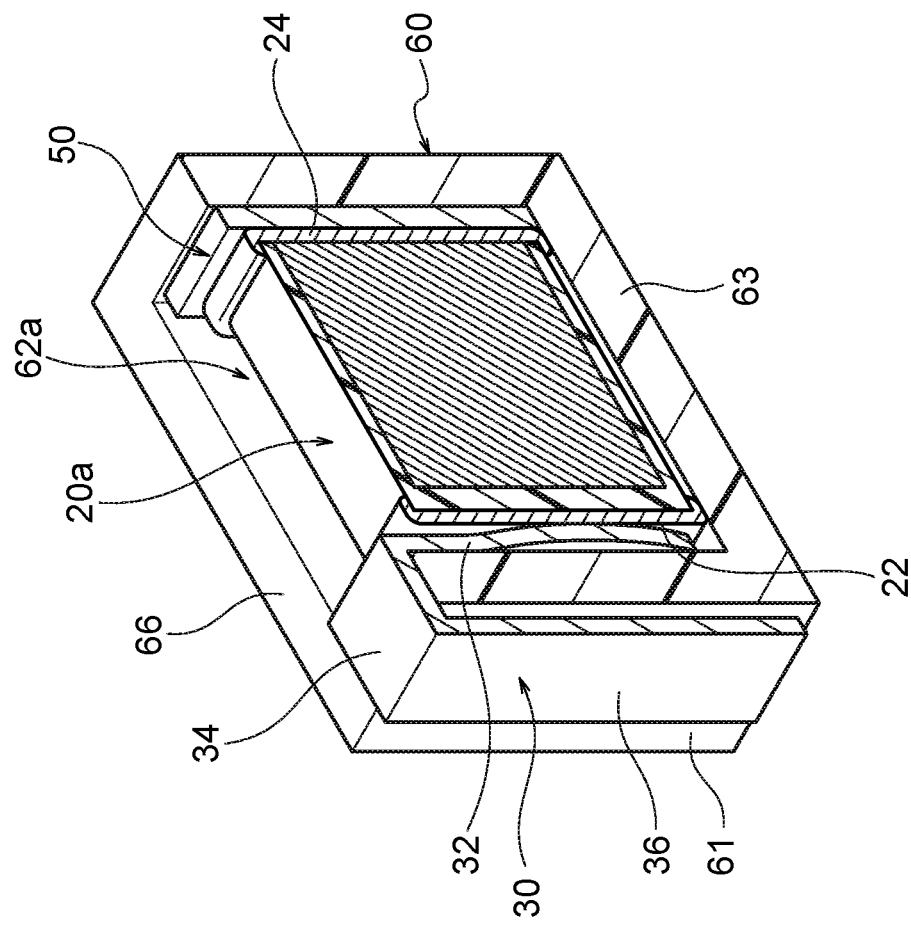
FIG. 4 is a cross-sectional view of the electronic device along the line IV-IV shown in FIG. 1.

A lateral electrode part 36 is formed continuously and integrally with the opening edge electrode part 34 along the outer surface (outer lateral wall) of the outer wall 61 of the insulating case 60. In the present embodiment, the lateral electrode part 36 is formed to extend in the Z-axis direction along the outer surface of the outer wall 61. Incidentally, as shown in FIG. 4, the lateral electrode part 36 does not need to be in contact with the outer wall surface of the outer wall 61 and may be disposed in parallel to the outer wall surface of the outer wall 61 with a predetermined gap. The opening edge electrode part 34 is preferably contacted with the opening edge surface 66 of the outer wall 61, but there may be some gap between the opening edge electrode part 34 and the opening edge surface 66 of the outer wall 61.

As shown in FIG. 1 and FIG. 2A, the second individual metal terminal 40 includes an inner electrode part 42 to be inserted along the other inner wall in the X-axis direction of the accommodation recess 62b (the other accommodation recess) of the insulating case 60. As shown in FIG. 3, the inner electrode part 42 is contacted and electrically connected to the first terminal electrode 22 of the capacitor chip 20b (the other capacitor chip in the Y-axis direction). An opening edge electrode part 44 is formed continuously to the inner electrode part 42 along the opening edge surface 66.

A lateral electrode part 46 is formed continuously and integrally with the opening edge electrode part 44 along the outer surface of the outer wall 61 of the insulating case 60. In the present embodiment, the lateral electrode part 46 is formed to extend in the Z-axis direction along the outer surface of the outer wall 61.

As with the lateral electrode part 36, the lateral electrode part 46 does not need to be in contact with the outer wall surface of the outer wall 61 and may be disposed in parallel to the outer wall surface of the outer wall 61 with a predetermined gap. The opening edge electrode part 44 is preferably contacted with the opening edge surface 66 of the outer wall 61, but there may be some gap between the opening edge electrode part 44 and the opening edge surface 66 of the outer wall 61. The first individual metal terminal 30 and the second individual metal terminal 40 are attached to the insulating case 60 at a predetermined interval in the Y-axis direction (corresponding to a thickness of the partition wall 64 in the Y-axis direction) and are insulated from each other.

In the present embodiment, the length of the accommodation recess 62a (62b) in the X-axis direction is determined so that the terminal electrodes 22 and 24 of the capacitor chip 20a (20b) are pressed and contacted with the inner electrode parts 32 (42) and 52 while the terminals 30 (40) and 50 are attached to the insulating case 60. Incidentally, the terminal electrodes 22 and 24 of the capacitor chips 20a and 20b may be pressed and contacted with the inner electrode parts 32, 42, and 52 of the terminals 30, 40, and 50 by deformation of an elastic sheet interposed between the inner electrode parts 32, 42, and 52 and the inner wall surfaces of the accommodation recesses 62a and 62b.

The width of the accommodation recess 62a (62b) in the Y-axis direction is determined so that the capacitor chip 20a (20b) can enter the accommodation recess 62a (62b). The depth of the accommodation recess 62a (62b) in the Z-axis direction is determined so that the upper end of the capacitor chip 20a (20b) in the Z-axis direction does not protrude upward from the opening edge surface 66 in the Z-axis direction when the chip 20a (20b) is accommodated in the accommodation recess 62a (62b), but the upper end of the chip 20a (20b) in the Z-axis direction may slightly protrude upward from the opening edge surface 66 in the Z-axis direction. The insulating case 60 is made of an insulator, such as ceramic, glass, and synthetic resin, and the insulator may be made of a flame retardant material.

In the present embodiment, the capacitor chips 20a and 20b can be easily accommodated in the accommodation recesses 62a and 62b. The capacitor chips 20a and 20b can be effectively protected from, for example, impacts by being accommodated tin the accommodation recesses 62a and 62b.

In the present embodiment, as shown in FIG. 2A, the common metal terminal 50 connects the second terminal electrodes 24 and 24 of the capacitor chips 20a and 20b different from each other at a position facing the metal terminals 30 and 40. The first individual metal terminal 30 and the second individual metal terminal 40 are connected to the first individual metal terminals 22 and 22 of the capacitor chips 20a and 20b different from each other. As a result, the capacitor chips 20a and 20b are connected in series between the first individual metal terminal 30 and the second individual metal terminal 40.

The first individual metal terminal 30 and the second individual metal terminal 40 have the same structure and are each formed by bending one conductive plate piece (e.g., metal plate) into a substantially C shape. The metal plate has any thickness, but preferably has a thickness of about 0.01-2.0 mm. The thickness of the metal plate constituting the common metal terminal 50 is approximately the same as that of each of the first individual metal terminal 30 and the second individual metal terminal 40.

Figure 2C:
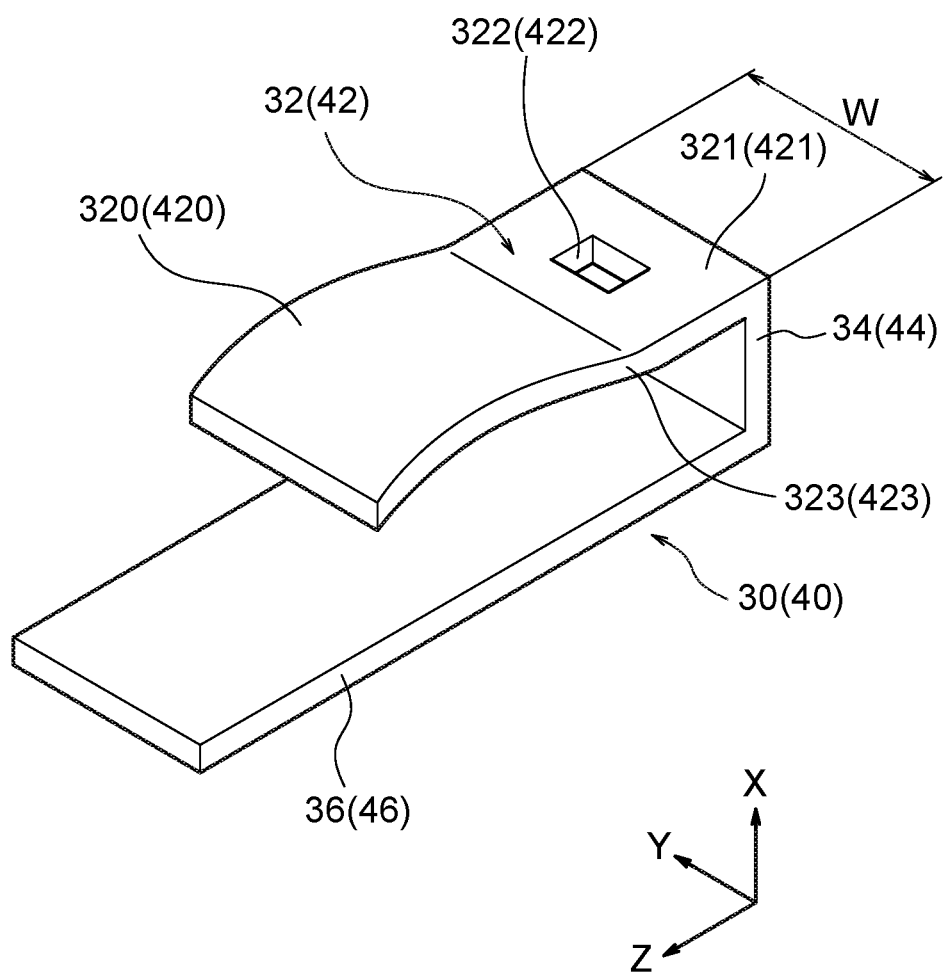
FIG. 2C is a schematic perspective view of the metal terminal shown in FIG. 2A viewed from a different angle.
Figure 2D:
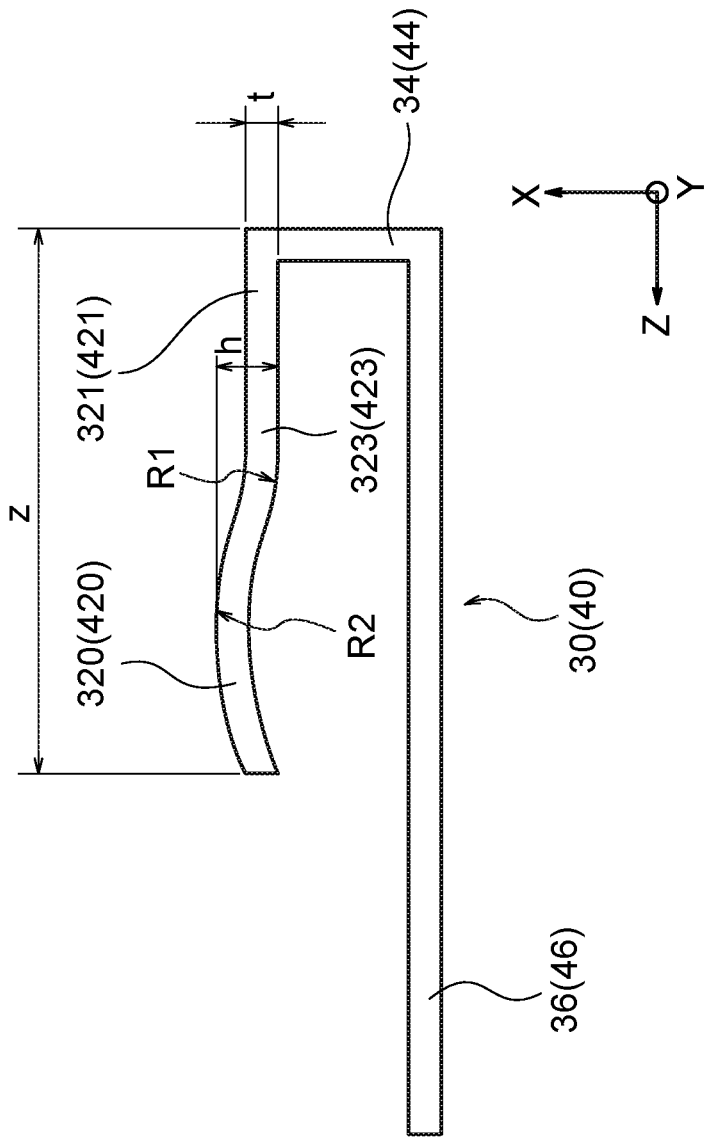
FIG. 2D is a lateral view of the metal terminal shown in FIG. 2C.

In the present embodiment, as shown in FIG. 2C and FIG. 2D, the inner electrode part of the metal terminal 30 (40) includes a base part 321 (421) having a flat plate shape and continuing to the opening edge electrode part 34 (44). A through hole 322 (422) is formed in the base part 321 (421).

A curved part 320 (420) protruding away from the lateral electrode part 36 is formed near a tip of the base part 321 (421). As shown in FIG. 2A, the curved part 320 (420) is contacted with the terminal electrode 22 of the capacitor chip 20a (20b) with a predetermined elastic force (spring force) and is electrically connected therewith. In a boundary part between the base part 321 (421) and the curved part 320 (420), as shown in FIG. 2D, a continuous boundary part 323 (423) continuously connecting them is formed.

As shown in FIG. 2D, the continuous boundary part 323 (423) continuously connects the base part 321 (421) and the curved part 320 (420), and a first radius of curvature (R1) of the continuous boundary part is preferably 0.5-15 mm (more preferably, 3.0-10 mm).

Preferably, a height (h) from an inner surface of the base part 321 (421) to a maximum protrusion position of the curved part 320 (420) is 0.48-0.6 mm. Preferably, a length (z) of the inner electrode part in the Z-axis direction is 4.0-6.0 mm.

Moreover, the curved part 320 (420) is curved on the other side of a curve by the first radius of curvature (R1), and a second radius of curvature (R2) of the curved part 320 (420) is preferably 1.0-6.0 mm (more preferably, 2.0-5.0 mm). A thickness (t) of the inner electrode part is preferably 0.05-0.35 mm (more preferably, 0.1-0.35 mm). As shown in FIG. 2C, a width (w) of the inner electrode part 32 (42) in the Y-axis direction is preferably 1.8-2.5 mm.

The present inventors have found that six dimensions of R1, R2, h, z, t, and w shown in FIG. 2C and FIG. 2D greatly affect a spring constant (k) of the metal terminal 30 (40) and also have found that the spring constant (k) can be calculated by the following formula 1. That is, the present inventors have found that the spring constant (k) of the metal terminal 30 (40) can be calculated using the following formula 1 in the above-mentioned numerical ranges even if a complicated simulation taking a lot of time is not carried out. The present inventors have confirmed that the spring constant (k) calculated by the following formula 1 substantially corresponds with that of a simulation result.

$$k = f(R1, R2, h, z, w, t) = \frac{wt^{A+BR1}}{(z + C\sin(\alpha R1) + D\exp(\beta R1))^{E+FR1}} \quad \text{Formula 1}$$
$$\{(GhR2 + HR2)\exp(\gamma R1) + (IhR2 + JR2 + Kh + L)]$$

A, B, C, D, E, F, G, H, I, J, K, L, $\alpha$, $\beta$, and $\gamma$ are constant terms.

The present inventors have found that a stress acting on the metal terminal 30 (40) is greatly affected by four dimensions of R1, R2, z, and t shown in FIG. 2C and a displacement $\Delta x$ of the curved part in the X-axis direction and also have found that the stress ($\sigma$) can be calculated by the following formula 2. That is, the present inventors have found that the stress ($\sigma$) of the metal terminal 30 (40) can be calculated using the following formula 2 in the above-mentioned numerical ranges even if a complicated simulation taking a lot of time is not carried out. The present inventors have confirmed that the stress ($\sigma$) calculated by the following formula 2 substantially corresponds with that of a simulation result. Incidentally, the displacement $\Delta x$ of the curved part in the X-axis direction is preferably 0.01-0.2 (more preferably, 0.05-0.15).

$$\sigma = f(R1, R2, h, z, w, t, \Delta x) = \quad \text{Formula 2}$$
$$\frac{t\Delta x}{(z+A)^B}(CR1R2 + DR1 + ER2 + F)$$

A, B, C, D, E, and F are constant terms. No dependency on h or w.

In the present embodiment, the spring constant (k) of the curved part 320 (420) of the metal terminal 30 (40) and the stress ($\sigma$) acting on the inner electrode part 32 (42) of the metal terminal 30 (40) can easily be obtained using the above-mentioned formula 1 and formula 2. It is thereby possible to easily find six dimensions of R1, R2, h, z, t, and w for maximizing the spring constant (k) and minimizing the stress ($\sigma$) without carrying out repeated simulations.

For example, when R1=10.0 mm, R2=3.0 mm, z=6.0 mm, h=0.6 mm, w=2.0 mm, and t=0.05 mm are satisfied, the spring constant (k) is 0.13 N/mm, which is easily obtained by the above-mentioned formula 1, and the stress ($\sigma$) (at the time of deformation of 0.1 mm) is 54.2 MPa, which is easily obtained by the above-mentioned formula 2. According to this result, the stress of the metal terminal 30 (40) is low and favorable, but the spring constant is too low and unfavorable. That is, in this configuration, the stress is low and the safety factor is high, but the metal terminal is easily bendable due to low spring constant, and the holding power for the chip component is weak.

When R1=3.0 mm, R2=5.0 mm, z=5.0 mm, h=0.6 mm, w=2.3 mm, and t=0.3 mm are satisfied, the spring constant (k) is 101.8 N/mm, which is easily obtained by the above-mentioned formula 1, and the stress ($\sigma$) (at the time of deformation of 0.1 mm) is 557.4 MPa, which is easily obtained by the above-mentioned formula 2. According to this result, the spring constant is high and favorable, but the stress is too high. That is, in this configuration, the holding force for the chip component is high, but the safety factor is low due to high stress, and there are difficulties with durability.

When R1=1.0 mm, R2=5.0 mm, z=5.0 mm, h=0.6 mm, w=2.3 mm, and t=0.1 mm are satisfied, the spring constant (k) is 4.75 N/mm, which is easily obtained by the above-mentioned formula 1, and the stress ($\sigma$) (at the time of deformation of 0.1 mm) is 1.34 MPa, which is easily obtained by the above-mentioned formula 2. According to this result, the spring constant of the metal terminal 30 (40) is comparatively high and favorable, and the stress is comparatively low. That is, in this configuration, the holding force for the chip component can be high, the safety factor is high due to low stress, and the durability is excellent.

That is, in the present embodiment, the holding force for the chip component is high, and the metal terminal 30 (40) excellent in durability can be configured extremely easily.

Hereinafter, a method of manufacturing the electronic device 10 is explained.

The capacitor chips 20a and 20b are manufactured by a method of manufacturing a normal multilayer ceramic capacitor.

In the manufacture of the first individual metal terminal 30, a flat metal plate is initially prepared. The metal plate is made of any conductive metal, such as iron, nickel, copper, silver, and alloy containing them. Then, the metal plate is machined to obtain an intermediate member having the shapes of the inner electrode part 32, the opening edge electrode part 34, and the lateral electrode part 36.

Next, the first individual metal terminal 30 is obtained by forming a metal film by plating on the surface of the intermediate member formed by machining. Any material, such as Ni, Sn, and Cu, is used for plating. In the manufacture of the first individual metal terminal 30, multiple first individual metal terminals 30 may be formed in a state of being connected to each other from a metal plate continuing with a strip shape. The second individual metal terminal 40 is manufactured similarly to the first individual metal terminal 30.

In the manufacture of the common metal terminal 50, the above-mentioned metal plate is machined to obtain an intermediate member having the shape of the common metal terminal 50, and a metal film is formed on this intermediate member by plating. The insulating case 60 can be manufactured by injection molding or so.

The first individual metal terminal 30, the second individual metal terminal 40, and the common metal terminal 50 obtained in the above-mentioned manner are attached to the insulating case 60. The metal terminals 30 and 40 can be attached to the insulating case 60 by respectively inserting the inner electrode parts 32 and 42 along the inner wall surface formed on one side in the X-axis direction of the accommodation recesses 62*a* and 62*b* of the insulating case 60. The common metal terminal 50 can be attached to the insulating case 60 by inserting the inner electrode part 52 along the communication groove 65 and the inner wall surfaces of the accommodation recesses 62*a* and 62*b*.

Finally, the electronic device 10 shown in FIG. 1 can be manufactured only by respectively inserting the capacitor chips 20*a* and 20*b* into the accommodation recesses 62*a* and 62*b* from above the openings.

In the electronic device 10 according to the present embodiment, the electronic device 10 is assembled only by accommodating the multiple capacitor chips 20*a* and 20*b* into the accommodation recesses 62*a* and 62*b* from the opening formed on only one surface of the insulating case 60. In addition, the capacitor chips 20*a* and 20*b* can be easily connected in series by attaching the inner electrode part 52 of the common metal terminal 50 along the inner wall of the insulating case 60.

Incidentally, the capacitor chips 20*a* and 20*b* can be connected in parallel by attaching the same individual metal terminals 30 and 40 to both of the inner wall surfaces of the respective accommodation recesses 62*a* and 62*b* in the X-axis direction without using the common metal terminal 50.

In the electronic device 10 according to the present embodiment, the opening edge electrode parts 34 and 44 and the lateral electrode parts 36 and 46 of the individual metal terminals 30 and 40 are drawn out of the insulating case 60. For this reason, it is unnecessary to dispose, for example, a through hole on the inner wall surfaces constituting the accommodation recesses 62*a* and 62*b* of the case 60. Thus, even if a molten resin is filled in the accommodation recesses 62*a* and 62*b* of the case 60 in which the capacitor chips 20*a* and 20*b* are accommodated, the resin can effectively be prevented from protruding from a through hole or so. That is, the present embodiment can also use the accommodation recesses 62*a* and 62*b* as a filling space of the resin.

Figure 5A:
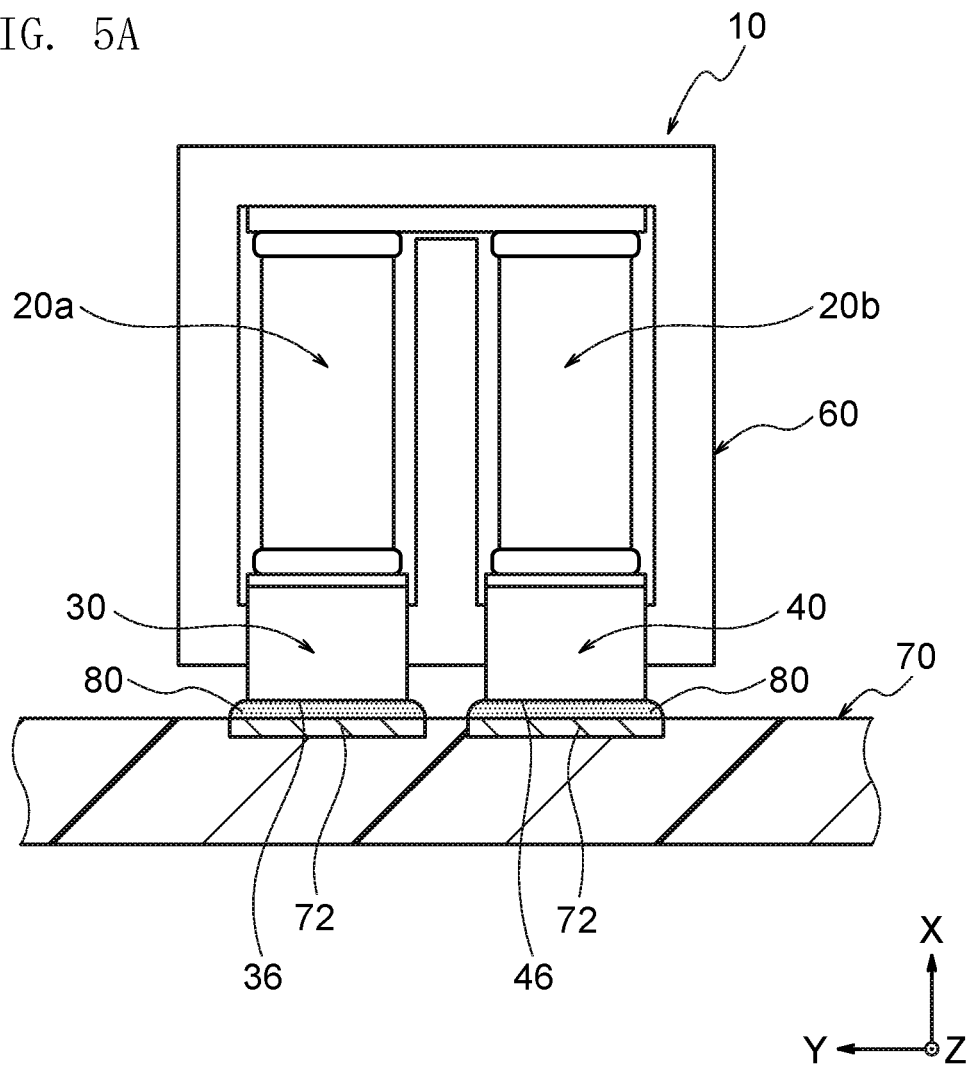
FIG. 5A is a front view of a mounted state of the electronic device shown in FIG. 1.
Figure 5B:
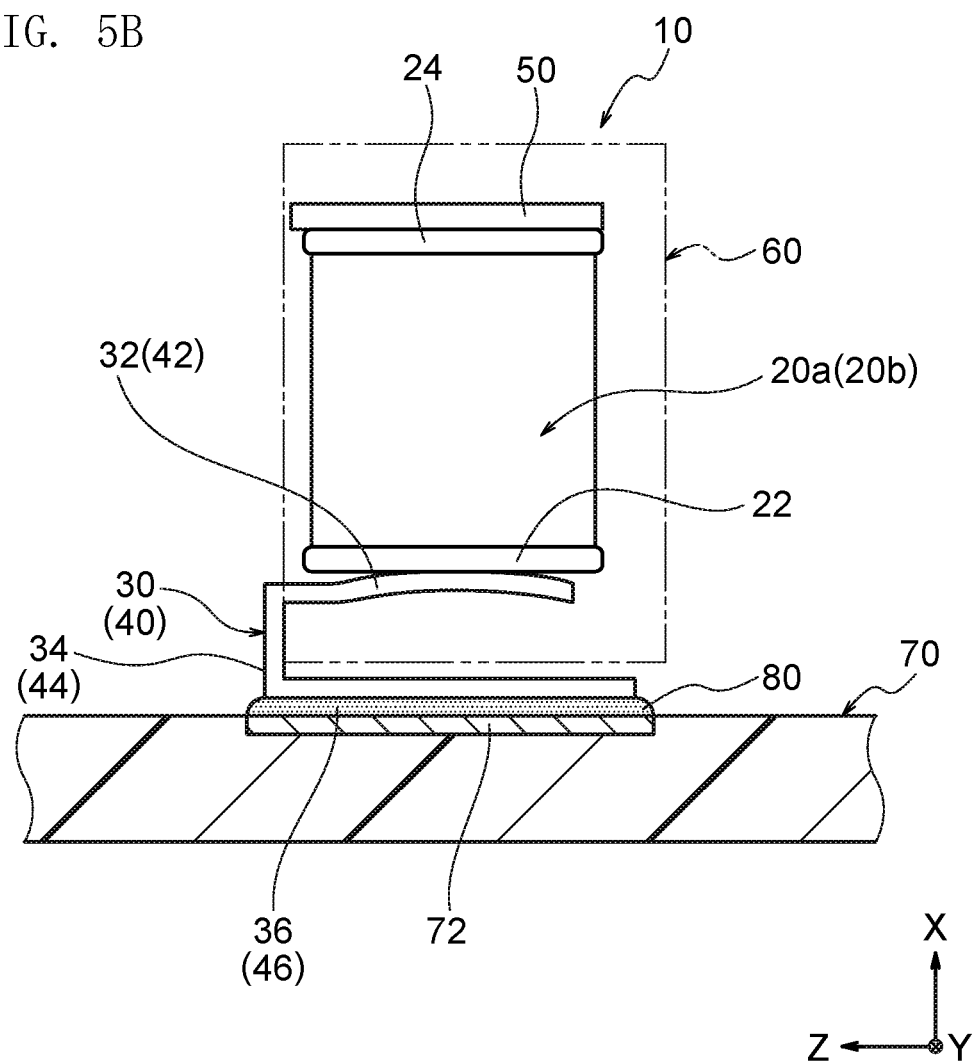
FIG. 5B is a lateral view of the mounted state of the electronic device shown in FIG. 5A.

In the electronic device 10 according to the present embodiment, as shown in FIG. 5A and FIG. 5B, the lateral electrode parts 36 and 46 of the individual metal terminals 30 and 40 exposed outside the insulating case 60 are used as electrode surfaces for mounting. In particular, when the lateral electrode parts 36 and 46 are used as electrode surfaces for mounting, it is possible to improve the strength of fixing the electronic device 10 to the individual circuit patterns 72 and 72 of a circuit board (external circuit) 70.

The individual circuit patterns 72 and 72 of the circuit board (external circuit) 70 and the lateral electrode parts 36 and 46 of the electronic device 10 can be connected by, for example, a solder 80, but may be connected by a connection member other than the solder 80, such as a conductive adhesive and an anisotropic conductive tape. The resonance of the electronic device 10 is easily reduced by forming a gap between the lateral electrode parts 36 and 46 and the outer surface of the lateral wall of the case 60.

Incidentally, as shown in FIG. 5A and FIG. 5B, the surface of the circuit board 70 is disposed substantially perpendicularly to the X-axis so as to connect the individual circuit patterns 72 and 72 of the circuit board (external circuit) 70 and the lateral electrode parts 36 and 46 of the electronic device 10.

Figure 5C:
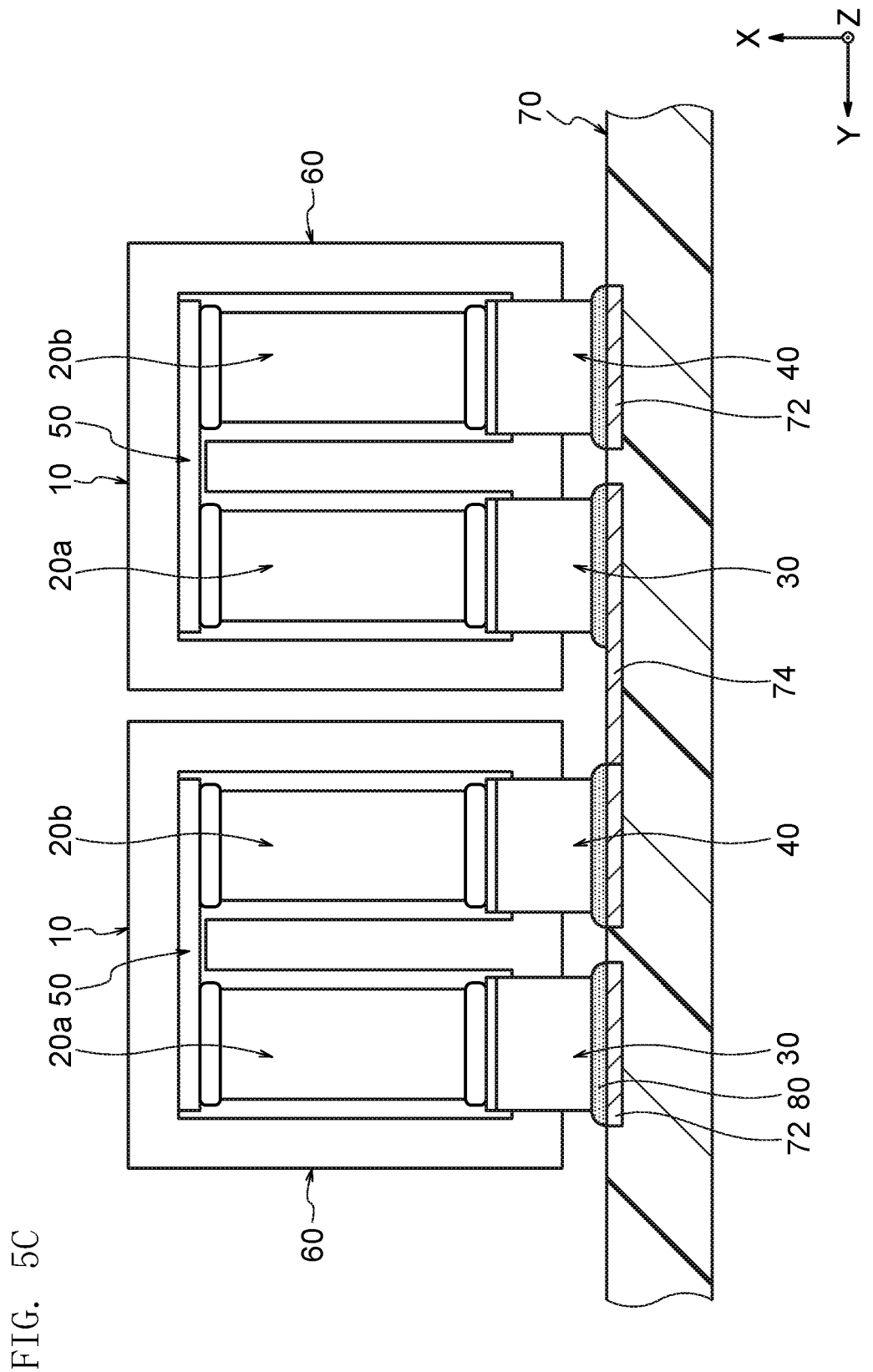
FIG. 5C is a front view of another mounted state of the electronic device shown in FIG. 1.

In the present embodiment, as shown in FIG. 5C, when the insulating cases 60 of the multiple electronic devices 10 are arranged next to each other, the individual metal terminals 30 and 40 of the different insulating cases 60 can be connected to each other via a common circuit pattern 74 of the circuit board 70. In this case, four capacitor chips 20*a*, 20*b*, 20*a*, and 20*b* can be connected in series in total. That is, the degree of freedom of mounting the electronic devices 10 is improved. Moreover, the electronic device 10 of the present embodiment is comparatively compact. Instead of the connection via the common circuit pattern 74 of the circuit board 70, four capacitor chips 20*a*, 20*b*, 20*a*, and 20*b* can also be connected in series in total by connecting the first individual metal terminal 30 and the second individual metal terminal 40 with an external conductor or so.

In the present embodiment, as shown in FIG. 1, the accommodation recesses 62*a* and 62*b* are provided with the partition wall 64 for dividing the adjacent capacitor chips 20*a* and 20*b*, and it is thereby easy to attach the capacitor chips 20*a* and 20*b* and to insulate the adjacent capacitor chips 20*a* and 20*b*. In addition, the communication groove 65 is formed in the partition wall 64, and the inner electrode part 52 of the common metal terminal 50 can be thereby easily inserted into the accommodation recesses 62*a* and 62*b*.

In the present embodiment, as exemplified in FIG. 5B, at least the surfaces of the inner electrode parts 32 and 42 of the individual metal terminals 30 and 40 are subjected to a solder adhesion prevention treatment. This structure makes it possible to prevent the solder 80 from entering the surroundings of the terminal electrodes 22 of the capacitor chips 20*a* and 20*b* and to effectively prevent so-called solder bridges.

Incidentally, the surfaces of the lateral electrode parts 36 and 46 are not subjected to a solder adhesion prevention treatment and are rather subjected to a surface treatment for easily attaching the solder 80 (including a film formation). The surfaces of the opening edge electrode parts 34 and 44 are determined on a case-by-case basis. When the surfaces of the opening edge electrode parts 34 and 44 are subjected to a solder adhesion prevention treatment, the solder rising can be prevented. When the fixation by the solder 80 is emphasized, however, the surfaces of the opening edge electrode parts 34 and 44 do not need to be subjected to a solder adhesion prevention treatment. For example, the solder adhesion prevention treatment is a peeling treatment of a tin plating film, to which the solder 80 easily adheres.

In the electronic device 10 according to the present embodiment, the metal terminals 30, 40, and 50 and the capacitor chips 20*a* and 20*b* can be connected without using solder. This makes it possible to use copper, copper alloy, or the like as a material of the metal terminal and to reduce equivalent series resistance (ESR). Since no solder is used, it is possible to reduce the risk of cracks occurring in the capacitor chips due to difference in thermal expansion.

Incidentally, the opening edge electrode parts 34 and 44 may be mounted on the individual circuit pattern 72 or the common circuit pattern 74. In this case, the opening surface of the case 60 is disposed on the mounting surface side, and the case 60 can thereby serve as a protective cover.

Second Embodiment

Figure 6A:
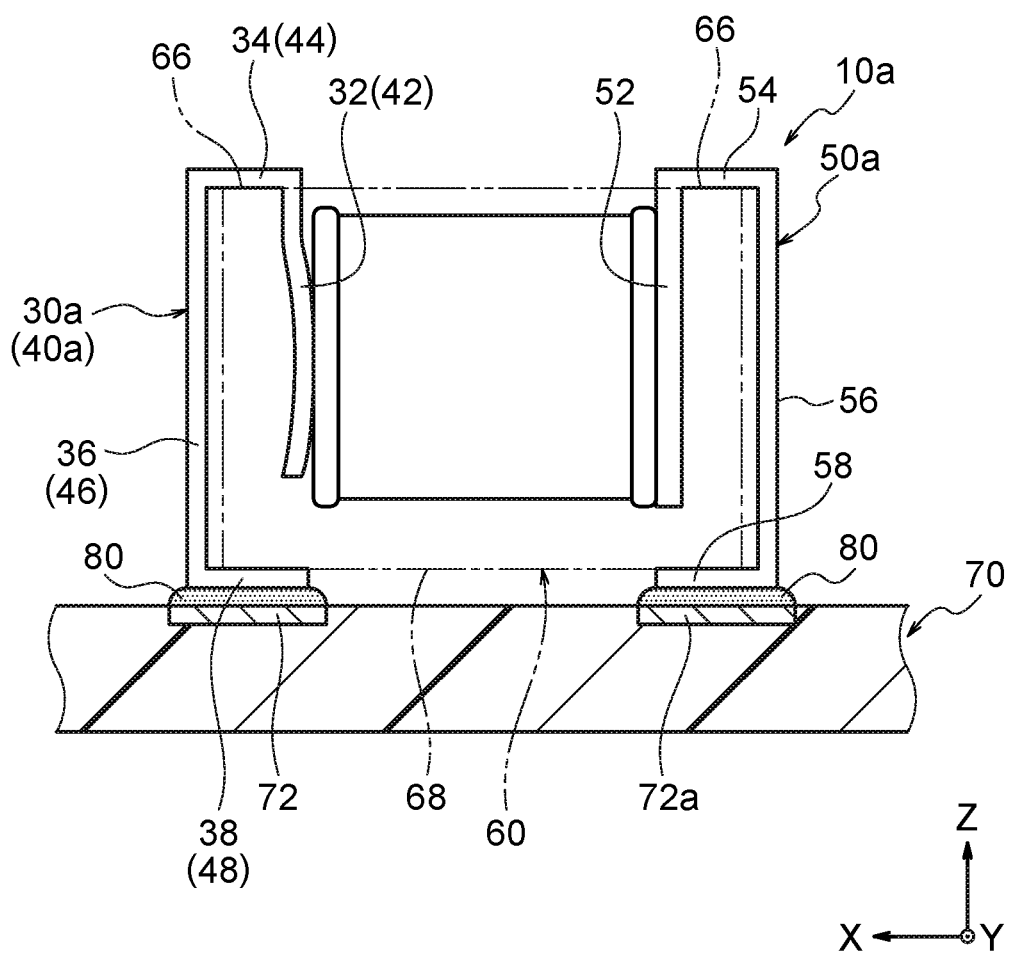
FIG. 6A is a lateral view of a mounted state of an electronic device according to another embodiment of the present invention.

Except for the following respects, an electronic device 10*a* according to the embodiment shown in FIG. 6A to FIG.

Figure 6B:
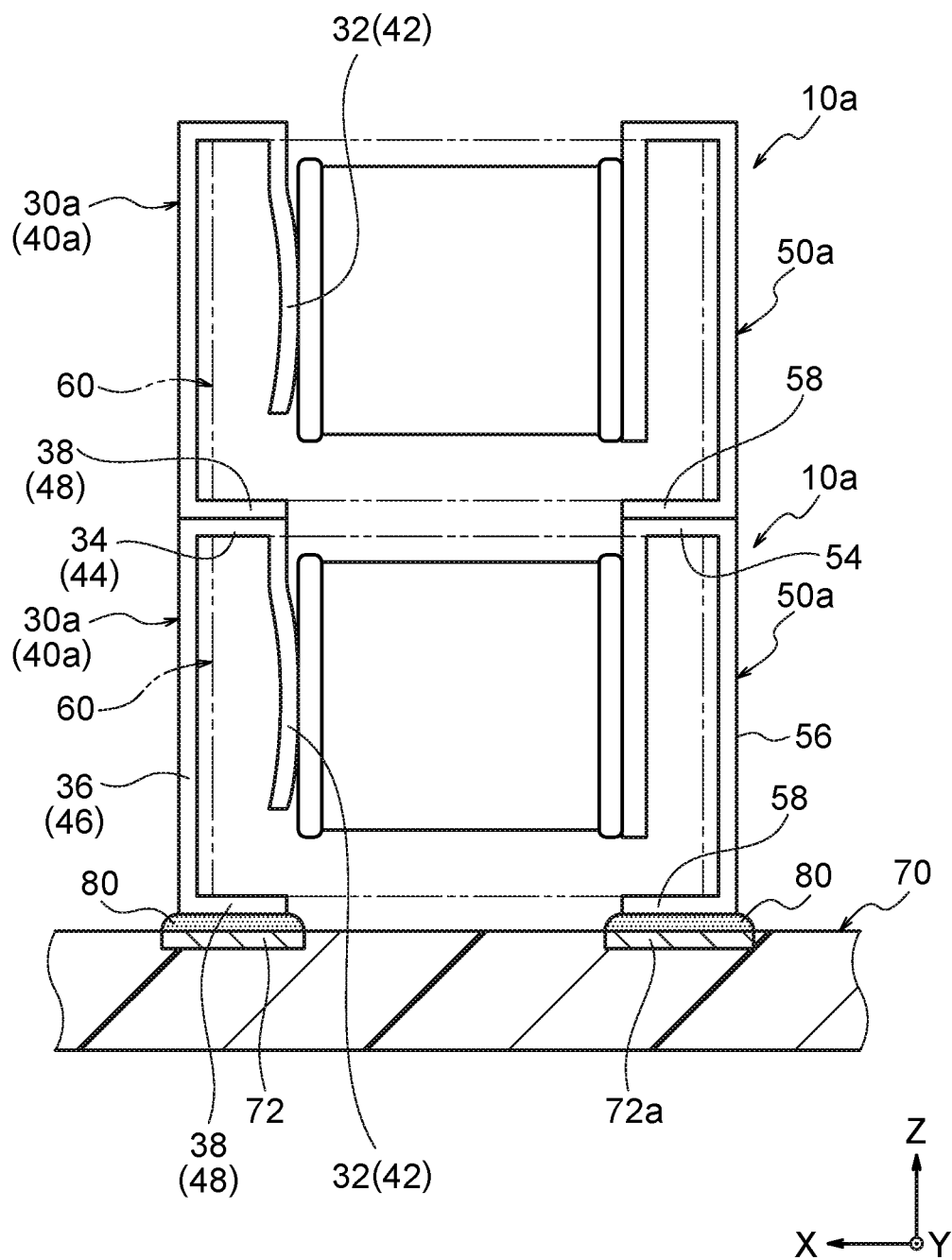
FIG. 6B is a lateral view of another mounted state of the electronic device according to the embodiment shown in FIG. 6A.
Figure 6C:
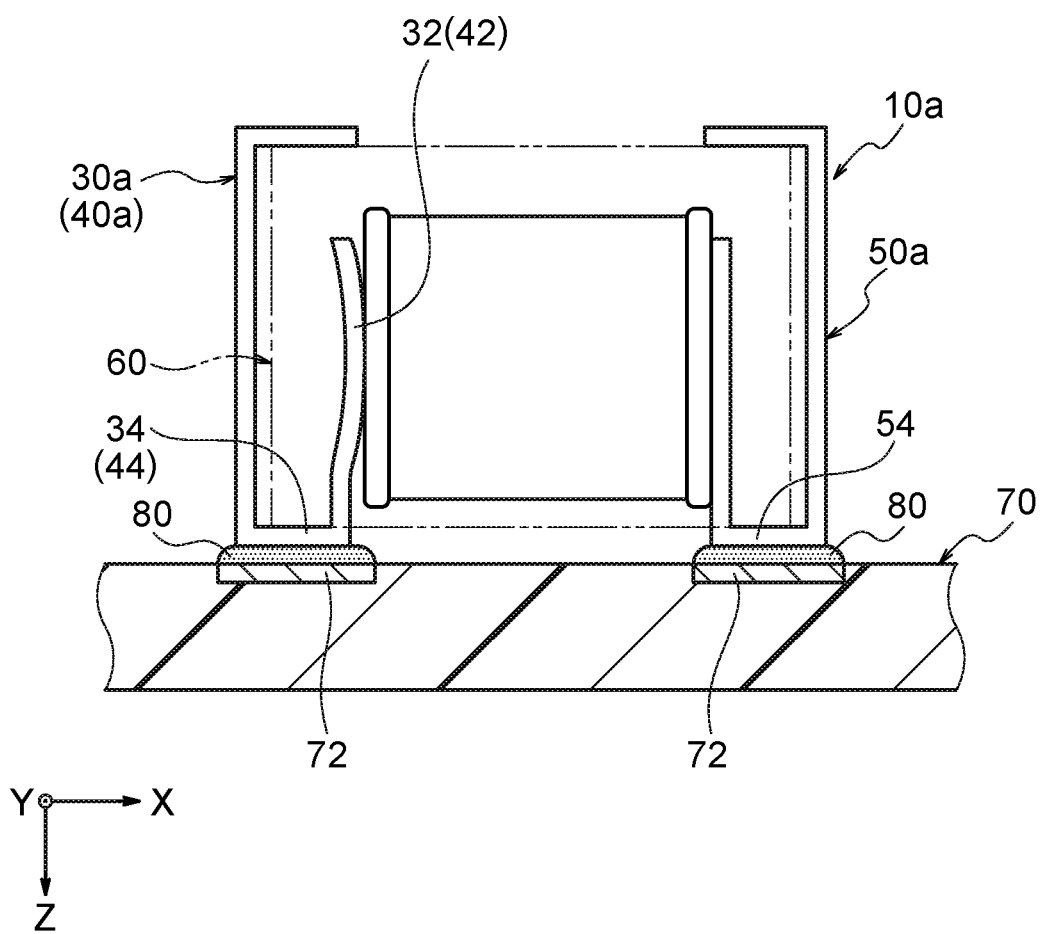
FIG. 6C is a lateral view of further another mounted state of the electronic device according to the embodiment shown in FIG. 6A.
Figure 7:
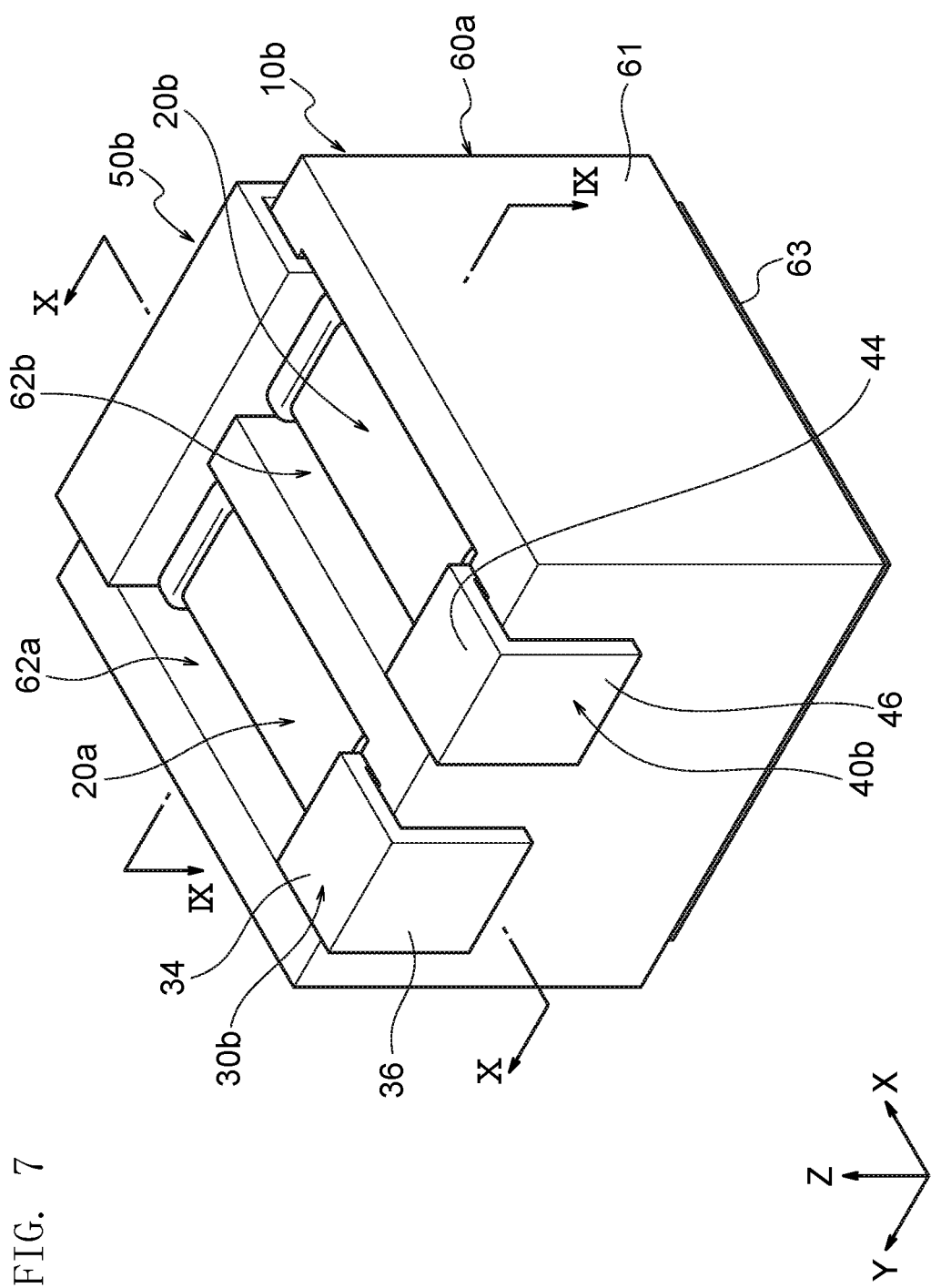
FIG. 7 is a schematic perspective view of an electronic device according to further another embodiment of the present invention.

6C has similar structure and effects to those of the electronic device 10 according to First Embodiment. In FIG. 6A to FIG. 6C, members common with those of the electronic device 10 according to First Embodiment are given the same reference numerals and are not partly explained.

In the electronic device 10a of the present embodiment, an individual metal terminal 30a (40a) further includes an anti-opening electrode part 38 (48) formed continuously to the lateral electrode part 36 (46) along an anti-opening surface (bottom surface) 68 of the insulating case 60 located on the other side of the opening edge surface 66.

A common metal terminal 50a further includes an opening edge electrode part 54 formed continuously to the inner electrode part 52 along the opening edge surface 66 and a lateral electrode part 56 formed continuously to the inner electrode part 52 along the outer surface of the insulating case 60. The common metal terminal 50a further includes an anti-opening electrode part 58 formed continuously to the lateral electrode part 56 along the anti-opening surface 68 of the case 60 located on the other side of the opening edge surface 66.

In the electronic device 10a according to the present embodiment, as shown in FIG. 6A, the anti-opening electrode parts 38, 48, and 58 can be used as electrode surfaces for mounting. That is, the anti-opening electrode parts 38, 48, and 58 can be connected to the individual circuit patterns 72, 72a, and the like of the circuit board 70 via the solder 80. Incidentally, the individual circuit pattern 72a connected with the common metal terminal 50a may be a floating pattern that is not connected to other circuit patterns.

As shown in FIG. 6A, when the individual circuit pattern 72a connected with the common metal terminal 50a is connected to another circuit pattern, two capacitors of a parallel circuit can be configured. On the other hand, when the individual circuit pattern 72a connected with the common metal terminal 50a is a floating pattern that is not connected to other circuit patterns, two capacitors of a series circuit can be configured. Since the anti-opening electrode parts 38a and 48 of the individual metal terminals 30a and 40a and the anti-opening electrode part 58 of the common metal terminal 50a are respectively connected to the individual circuit patterns 72 and 72a, the mounting strength between the electronic device 10a and the circuit board 70 can be improved, and resonance can be prevented.

Incidentally, as shown in FIG. 6B, multiple electronic devices 10a according to the present embodiment may be stacked and connected in the Z-axis direction. In this case, preferably, the anti-opening electrode parts 38, 48, and 58 of the metal terminals 30a, 40a, and 50a of the electronic device 10a stacked on the upper side are connected to the opening edge electrode parts 34, 44, and 54 of the metal terminals 30a, 40a, and 50a of the electronic device 10a stacked on the lower side. The connection is carried out by any method, such as conductive adhesive, laser welding, and solder.

As shown in FIG. 6B, when the individual circuit pattern 72a connected with the common metal terminal 50a is connected to another circuit pattern, four capacitors can be a four-parallel circuit. On the other hand, when the individual circuit pattern 72a connected with the common metal terminal 50a is a floating pattern that is not connected to other circuit patterns, four capacitors can be a two-series and two-parallel circuit.

In the electronic device 10a according to the embodiment shown in FIG. 6C, the opening surface of the insulating case 60 may face downward in the Z-axis direction so as to connect the opening edge electrode parts 34, 44, and 54 of the metal terminals 30a, 40a, and 50a to the circuit pattern 72 of the circuit board 70 with solder or so. The electronic device 10a according to the present embodiment can have many variations when mounted on a circuit board or so. When the opening surface of the case 60 is disposed on the mounting surface side, the case 60 can serve as a protective cover. Furthermore, the mounting strength between the electronic device 10a and the circuit board 70 can be improved by connecting the opening electrode parts 34 and 44 of the individual metal terminals 30a and 40a and the opening edge electrode part 54 of the common metal terminal 50a to the individual circuit patterns 72 and 72a. In addition, resonance can be prevented.

Third Embodiment

Except for the following respects, an electronic device 10b according to the embodiment shown in FIG. 7 to FIG. 11 has similar structure and effects to those of the electronic device 10 or 10a according to the above-mentioned embodiment. In FIG. 7 to FIG. 11, members common with those of the electronic device 10 or 10a according to above-mentioned embodiment are given the same reference numerals and are not partly explained.

Figure 8A:
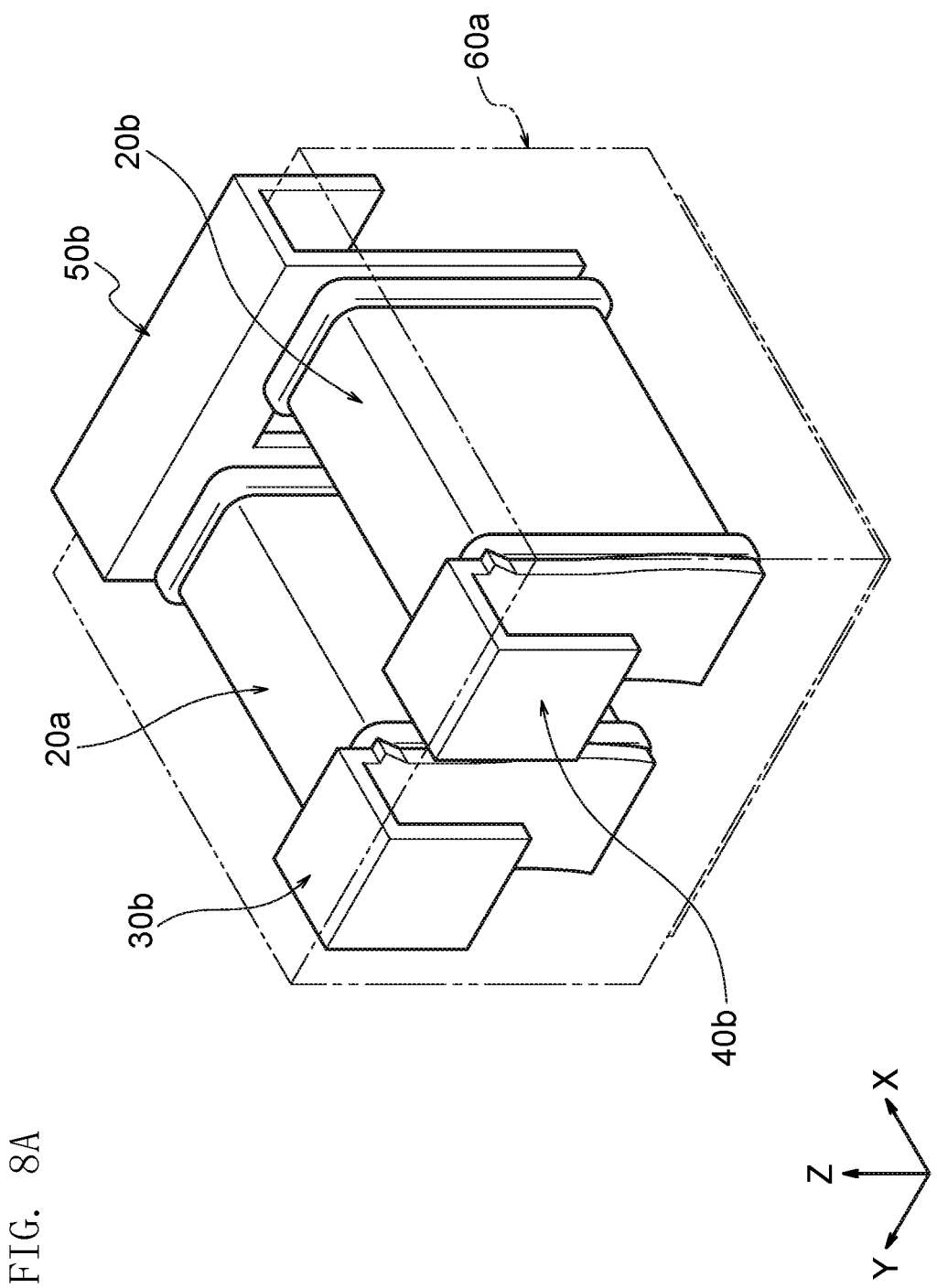
FIG. 8A is a schematic perspective view of the inside of the electronic device with a transparent case of FIG. 7.
Figure 8B:
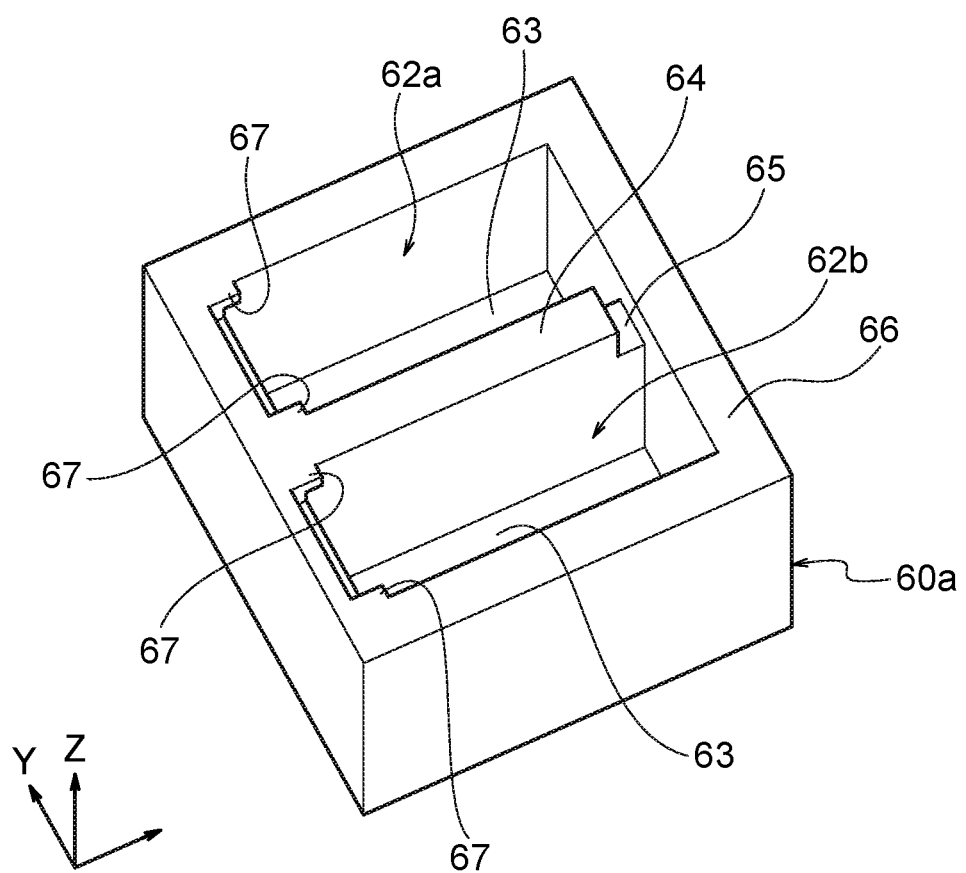
FIG. 8B is a schematic perspective view of the case shown in FIG. 7 viewed from a different angle.

In the electronic device 10b according to the present embodiment, as shown in FIG. 8B, an insulating case 60a includes multiple accommodation recesses 62a and 62b divided by the partition wall 64. The groove depth of the communication groove 65 in the Z-axis direction is shallower than that of the communication groove 65 according to each of the above-mentioned embodiments. The bottom wall 63 is formed separately for each of the accommodation recesses 62a and 62b. Engagement convexes 67 are formed at the corners of the opening surfaces of the accommodation recesses 62a and 62b located on the other side of the communication groove 65 in the X-axis direction.

Figure 8C:
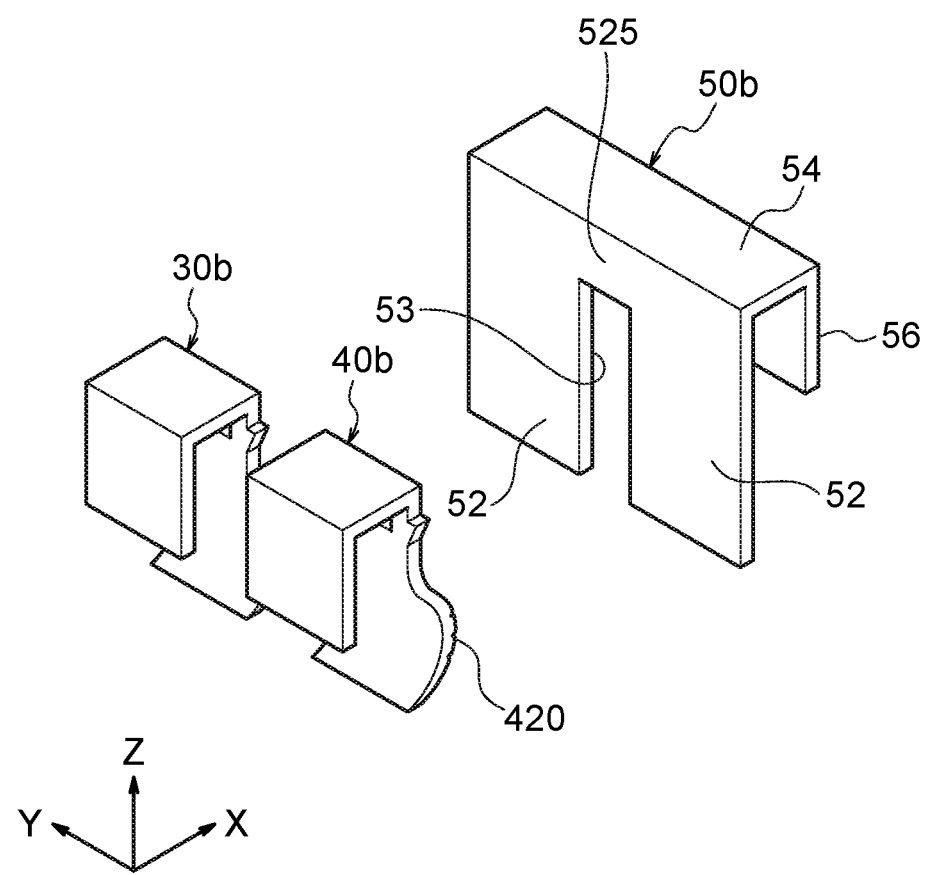
FIG. 8C is a schematic perspective view of the metal terminals shown in FIG. 7.

As shown in FIG. 8C, a common metal terminal 50b includes a pair of inner electrode parts 52. The inner electrode parts 52 are divided by a slit 53 extending in the Z-axis direction and are connected by a communication piece 525 and the opening edge electrode part 54. The lateral electrode part 56 is formed continuously to the opening edge electrode part 54. The inner electrode parts 52 are inserted along the inner wall surfaces of the accommodation grooves 62a and 62b in the X-axis direction near the communication groove 65 shown in FIG. 8B, and the communication piece 525 shown in FIG. 8C are engaged with the communication groove 65 shown in FIG. 8B.

Figure 8D:
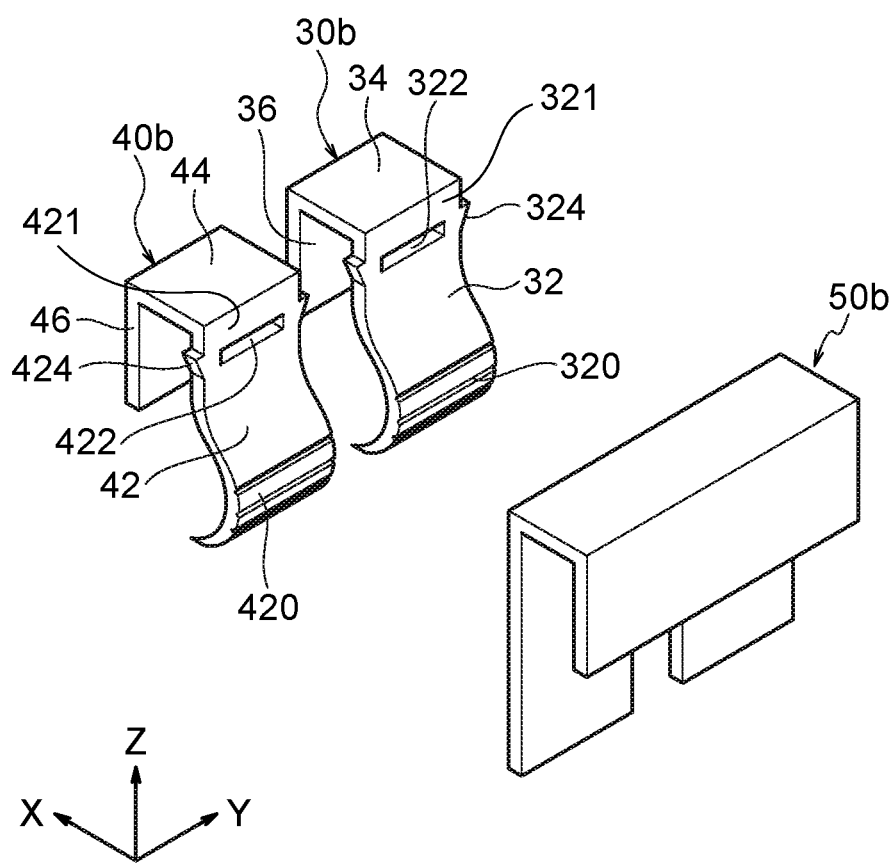
FIG. 8D is a schematic perspective view of the metal terminals shown in FIG. 8C viewed from a different angle.

In the present embodiment, as shown in FIG. 8D, an individual metal terminal 30b (40b) includes the inner electrode part 32 (42) to be inserted along one inner wall in the X-axis direction of the accommodation recess 62a (62b) of the insulating case 60a shown in FIG. 8B. In the present embodiment, the through hole 322 (422) elongated in the width direction (the Y-axis direction) is formed in the base part 321 (421) near the opening edge electrode part 34 (44) of the inner electrode part 32 (42).

Figure 11:
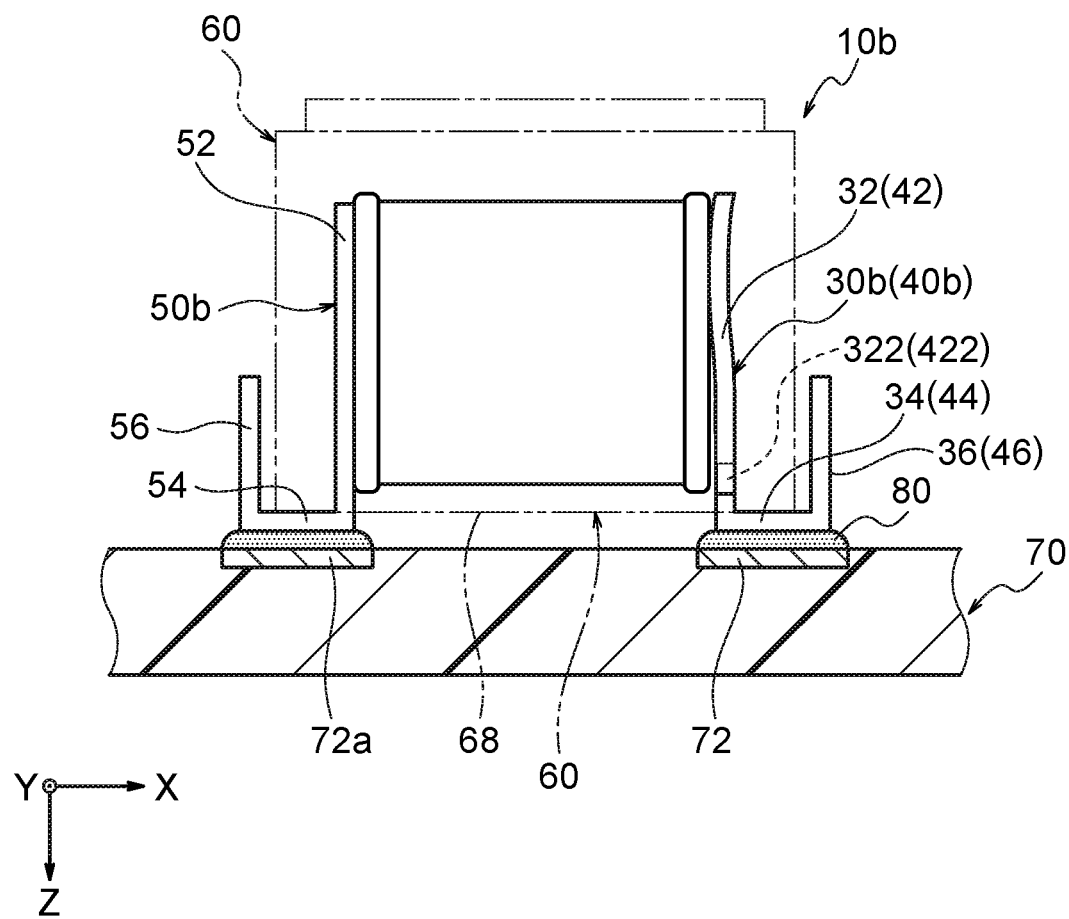
FIG. 11 is a partially transparent lateral view of a mounted state of the electronic device shown in FIG. 7.

As shown in FIG. 11, when the opening edge electrode part 34 (44) is connected to the circuit board 70 with the solder 80, solder rising toward the inner electrode part 32 (42) can be prevented by the through hole 322 (422). That is, so-called solder bridges can be prevented effectively.

In the present embodiment, engagement pieces 324 (424) projecting outward in the width direction (Y-axis direction) may be formed on both sides of the base part 321 (421) near the opening edge electrode part 34 (44) of the inner electrode part 32 (42). The engagement pieces 324 (424) can be engaged with the engagement convexes 67 formed on both sides in the Y-axis direction of one inner wall surface in the X-axis direction of the accommodation recess 62a (62b) of the insulating case 60a shown in FIG. 8B. Preferably, the engagement convexes 67 are formed to be flush with the opening edge surface 66.

When the inner electrode parts 32 and 42 of the individual metal terminals 30b and 40b shown in FIG. 8D are only inserted into the insulating case 60a shown in FIG. 8B, the engagement pieces 324 and 424 are engaged with the engagement convexes 67 in a one-touch manner, and the terminals 30b and 40b can be easily positioned and firmly fixed to the insulating case 60a.

Figure 9:
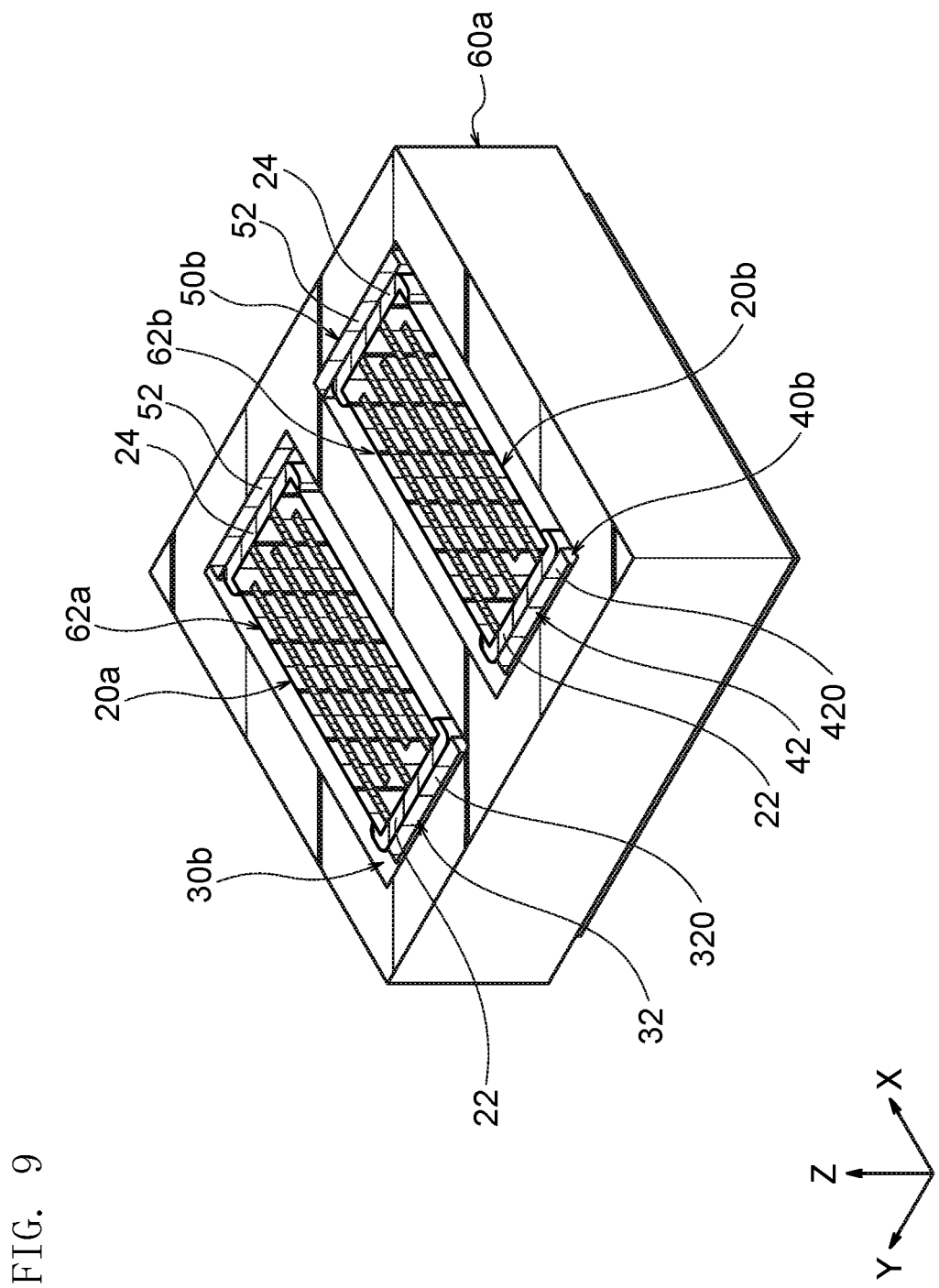
FIG. 9 is a cross-sectional view of the electronic device along the line IX-IX shown in FIG. 7.
Figure 10:
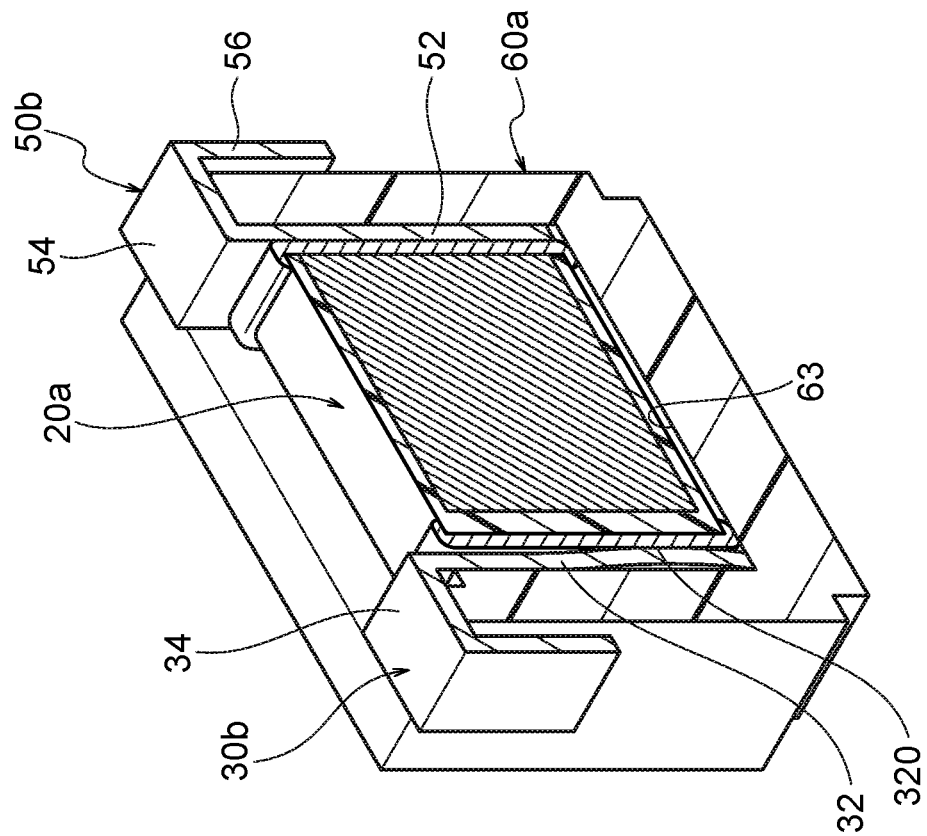
FIG. 10 is a cross-sectional view of the electronic device along the line X-X shown in FIG. 7.

In the present embodiment, as shown in FIG. 8D, the inner electrode part 32 (42) is provided with the curved part 320 (420) to be pressed by spring force toward the capacitor chip 20a (20b) shown in FIG. 9. Incidentally, FIG. 10 illustrates the curved part 320 pressed against the capacitor chip 20a by spring force. In this structure, the inner electrode part 32 (42) and the first terminal electrode 22 are connected in a pressure contact state, and the inner electrode part 52 of the common metal terminal 50b and the second terminal electrode 24 are connected in a pressure contact state. It is thereby unnecessary to connect them with a connection member, such as solder and conductive adhesive.

Since the metal terminals 30b, 40b, and 50b and the terminal electrodes 22 and 24 can be connected without using solder, copper, copper alloy, etc. can be used as the material of the terminals 30b, 40b, and 50b, and equivalent series resistance (ESR) can be reduced. Since no solder is used, it is possible to reduce the risk of cracks occurring in the capacitor chips 20a and 20b due to difference in thermal expansion.

In the present embodiment, for example, as shown in FIG. 11, the opening electrode parts 34 and 44 of the individual metal terminals 30b and 40b and the opening edge electrode part 54 of the common metal terminal 50b are connected to the individual circuit patterns 72 and 72a, and the mounting strength between the electronic device 10b and the circuit board 70 can thereby be improved. In addition, resonance can be prevented.

When the mounted common metal terminal 50b is connected to another circuit pattern, a two-parallel capacitor circuit can be configured. On the other hand, when the mounted common metal terminal 50b is not connected to another circuit pattern (a floating pattern), a two-series capacitor circuit can be configured. Furthermore, since the opening surface of the case 60 is disposed on the mounting surface side, the case 60 can serve as a protective cover.

Fourth Embodiment

Figure 12:
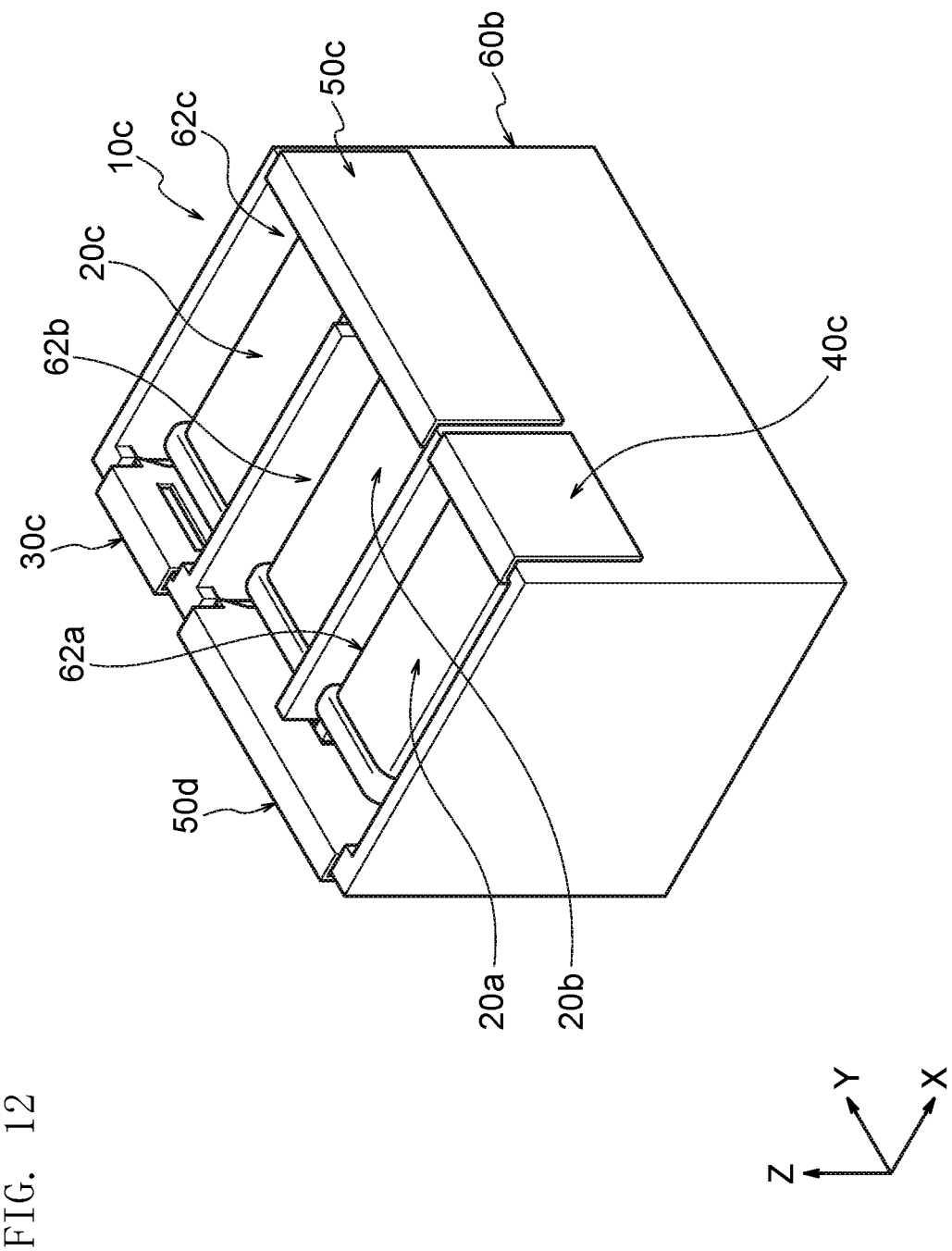
FIG. 12 is a schematic perspective view of an electronic device according to another embodiment of the present invention.
Figure 13A:
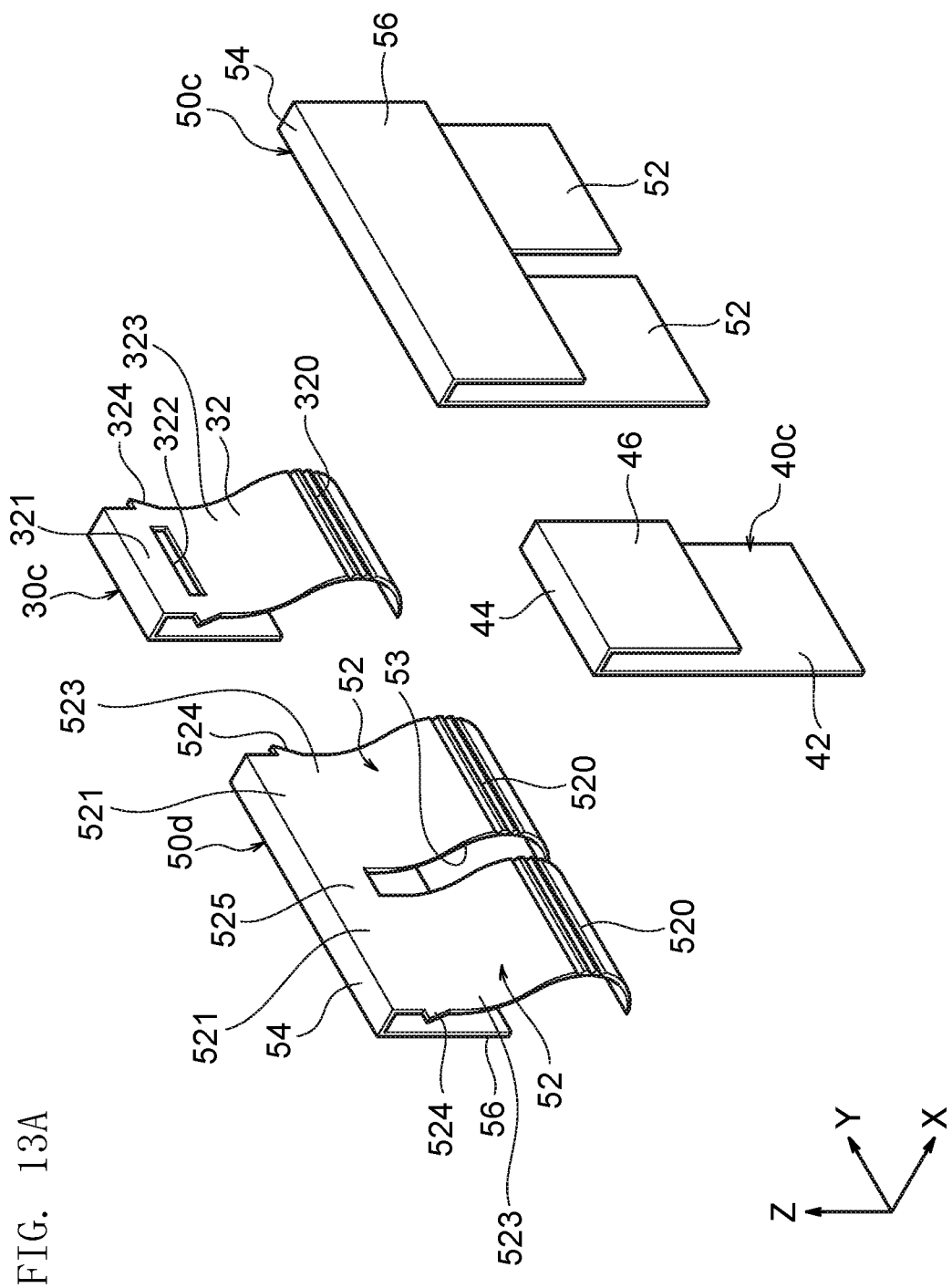
FIG. 13A is a schematic perspective view of the metal terminals shown in FIG. 12.
Figure 13B:
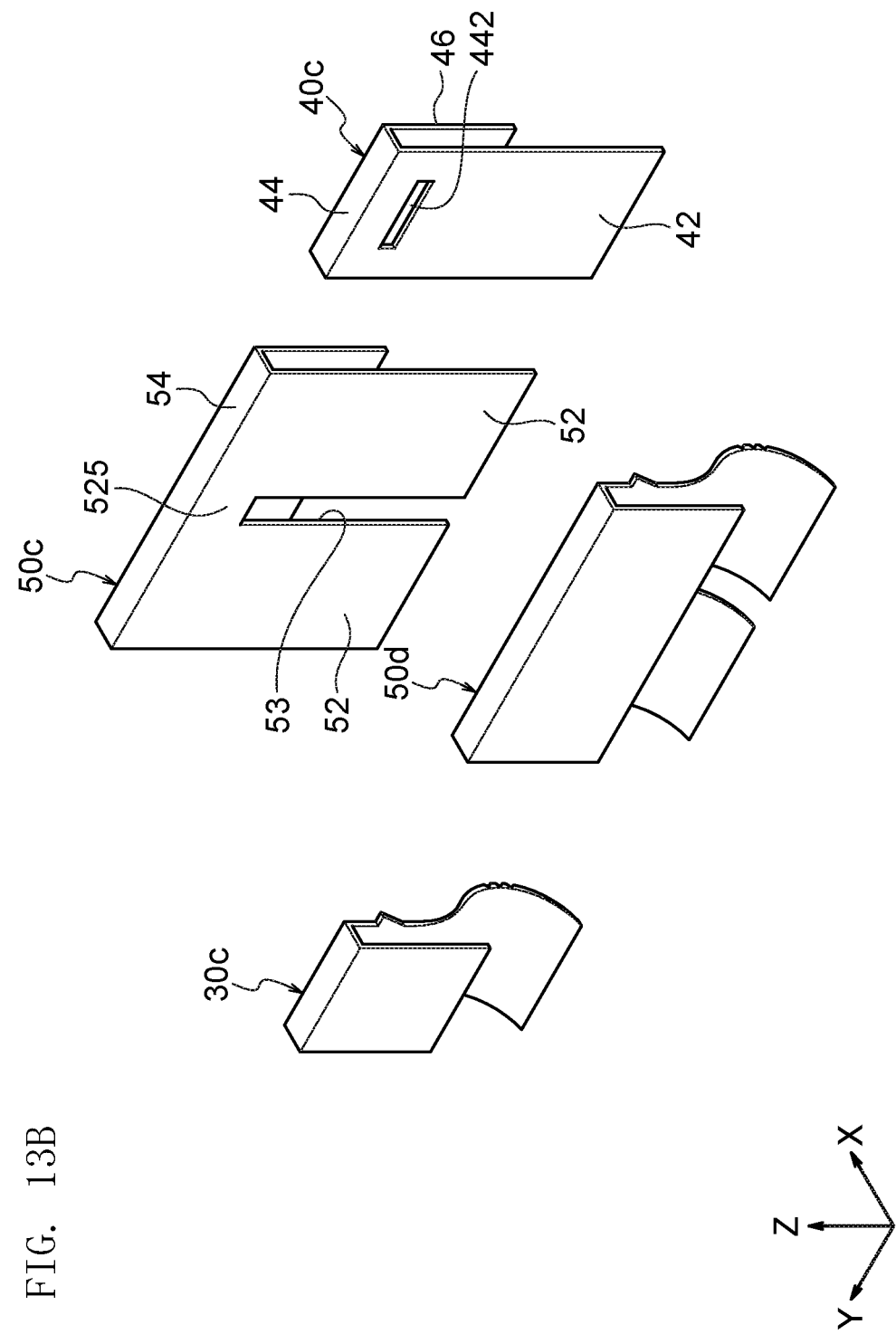
FIG. 13B is a schematic perspective view of the metal terminals shown in FIG. 13A viewed from a different angle.
Figure 13C:
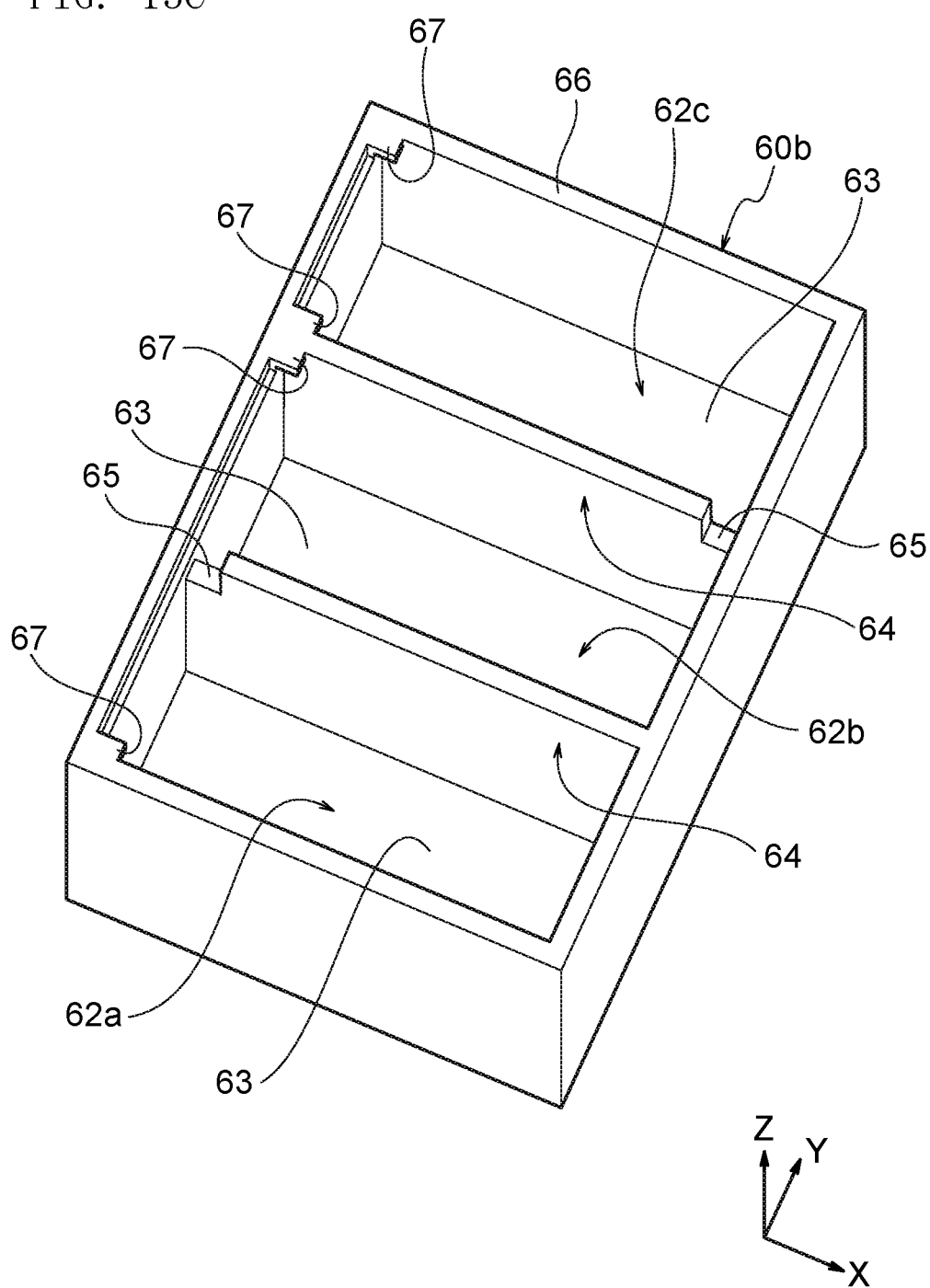
FIG. 13C is a schematic perspective view of the case shown in FIG. 12 viewed from a different angle.

Except for the following respects, an electronic device 10c according to the embodiment shown in FIG. 12 to FIG. 13C has similar structure and effects to those of the electronic device 10, 10a, or 10b according to the above-mentioned embodiment. In FIG. 12 to FIG. 13C, members common with those of the electronic device 10, 10a, or 10b of the above-mentioned embodiment are given the same reference numerals and are not partly explained.

In the electronic device 10c of the present embodiment, as shown in FIG. 13C, an insulating case 60b includes multiple accommodation recesses 62a to 62c divided by the partition walls 64. In the partition walls 64, the communication grooves 65 are formed alternately in the X-axis direction. The groove depth of each of the communication grooves 65 in the Z-axis direction is equal to that of the communication groove 65 of Third Embodiment. The bottom wall 63 of the accommodation recesses 62a to 62c is formed separately in each of the accommodation recesses 62a to 62c. In the present embodiment, except for where the communication groove 65 is located, the engagement convexes 67 are formed at the corners of the opening surface of each of the accommodation recesses 62a to 62c on one side of the insulating case 60b in the X-axis direction.

In the present embodiment, as shown in FIG. 12, two common metal terminals 50c and 50d and two individual metal terminals 30c and 40c are attached to the insulating case 60b. As shown in FIG. 13B, the common metal terminal 50c (one common metal terminal) includes a pair of inner electrode parts 52. The inner electrode parts 52 are separated by the slit 53 extending in the Z-axis direction and are connected by the communication piece 525 and the opening edge electrode part 54. The lateral electrode part 56 is formed continuously to the opening edge electrode part 54. The inner electrode parts 52 are inserted along the inner wall surfaces of the accommodation grooves 62b and 62c in the X-axis direction near the communication groove 65 shown in FIG. 13C, and the communication piece 525 shown in FIG. 13B is engaged with the communication groove 65 shown in FIG. 13C.

As shown in FIG. 13A, the common metal terminal 50d (the other common metal terminal) includes a pair of inner electrode parts 52. The inner electrode parts 52 are divided by the slit 53 extending in the Z-axis direction and are connected by the communication piece 525 and the opening edge electrode part 54.

The lateral electrode part 56 is formed continuously to the opening edge electrode part 54. The inner electrode parts 52 are inserted along the inner wall surfaces of the accommodation grooves 62a and 62b in the X-axis direction near the communication groove 65 shown in FIG. 13C, and the communication piece 525 shown in FIG. 13B is engaged with the communication groove 65 shown in FIG. 13C.

In the present embodiment, engagement pieces 524 projecting outward in the width direction (Y-axis direction) are formed on both of base parts 521 of the inner electrode parts 52 near the opening edge electrode part 54 on the other side of the slit 53 in the Y-axis direction. The engagement pieces 524 can be engaged with the engagement convexes 67 formed on the accommodation recesses 62a and 62b of the insulating case 60b shown in FIG. 13C. Preferably, the engagement convexes 67 are formed to be flush with the opening edge surface 66.

When the inner electrode parts 52 and 52 of the common metal terminal 50d shown in FIG. 13A are only inserted into the insulating case 60b shown in FIG. 13C, the engagement pieces 524 and 524 are engaged with the engagement convexes 67 in a one-touch manner, and the terminal 50d can be easily positioned and firmly fixed to the insulating case 60b.

In the present embodiment, as shown in FIG. 13A, continuous boundary parts 323 and 523 of the base parts 321 and 521 of the inner electrode parts 32 and 52 are provided with the curved parts 320 and 520 to be pressed by spring force toward the capacitor chips 20a and 20b shown in FIG. 12. In this structure, the inner lateral electrode parts 32 and 52 and one terminal electrodes of the capacitor chips 20a and 20b are connected in a pressure contact state, and at the same time, the other terminal electrodes of the capacitor chips 20a and 20b and the inner electrode part of the individual metal terminal 40c or one inner electrode part of the common metal terminal 50c are connected in a pressure contact state. It is thereby unnecessary to connect them with a connection member, such as solder and conductive adhesive.

In the present embodiment, as shown in FIG. 13A, the individual metal terminal 30c (one individual metal terminal) includes the inner electrode part 32 to be inserted along one inner wall in the X-axis direction of the accommodation recess 62c of the insulating case 60b shown in FIG. 13C, and as shown in FIG. 13B, the individual metal terminal 40c (the other individual metal terminal) includes the inner electrode part 42 to be inserted along the other inner wall in the X-axis direction of the accommodation recess 62a of the insulating case 60b shown in FIG. 13C.

In the present embodiment, the through hole 322 (422) elongated in the width direction (Y-axis direction) is formed near the opening edge electrode part 34 (44) of the inner electrode part 32 (42) of the individual terminal electrode 30c (40c).

When the opening edge electrode part 34 (36) is connected to the circuit board 70 with the solder 80, solder rising toward the inner electrode part 32 (42) can be prevented by the through hole 322 (422). That is, so-called solder bridges can be prevented effectively.

In the present embodiment, the engagement pieces 324 projecting outward in the width direction (Y-axis direction) are formed on both sides of the base part 321 (421) near the opening edge electrode part 34 of the inner electrode part 32 of the individual metal terminal 30c (one individual metal terminal). The engagement pieces 324 can be engaged with the engagement convexes 67 formed on both sides in the Y-axis direction of one inner wall surface in the X-axis direction of the accommodation recesses 62c of the insulating case 60b shown in FIG. 13C. Preferably, the engagement convexes 67 are formed to be flush with the opening edge surface 66.

When the inner electrode part 32 of the individual metal terminal 30c shown in FIG. 13A is only inserted into the insulating case 60b shown in FIG. 13C, the engagement pieces 324 are engaged with the engagement convexes 67 in a one-touch manner, and the terminal 30c can be easily positioned and firmly fixed to the insulating case 60b.

In the present embodiment, as shown in FIG. 13A, the inner electrode part 32 is provided with the curved part 320 to be pressed by spring force toward the capacitor chip 20c shown in FIG. 12. In this structure, the inner electrode part 32 and one terminal electrode of the capacitor chip 20c shown in FIG. 12 are connected in a pressure contact state, and the other terminal electrode of the capacitor chip 20c and the inner electrode part of the common metal terminal 50c are connected in a pressure contact state. It is thereby unnecessary to connect them with a connection member, such as solder and conductive adhesive.

In the present embodiment, the metal terminals 30c, 40c, 50c and 50d and the capacitor chips 20a to 20c can be connected in series without using solder. Thus, copper, copper alloy, etc. can be used as the material of the terminals 30c, 40c, 50c, and 50d, and equivalent series resistance (ESR) can be reduced. Since no solder is used, it is possible to reduce the risk of cracks occurring in the capacitor chips 20a to 20c due to difference in thermal expansion.

In the present embodiment, since the electronic device 10c includes the individual metal terminals 30c and 40c and the common metal terminals 50c and 50d, three or more capacitor chips 20a to 20c can be easily connected in series by connecting at least the individual metal terminals 30c and 40c to the circuit board. When three or more capacitor chips 20a to 20c are connected in series, it is possible to increase the withstand voltage of the electronic device 10c and to contribute to improvement in safety of the electronic equipment on which the electronic device 10c is mounted.

Fifth Embodiment

Figure 14:
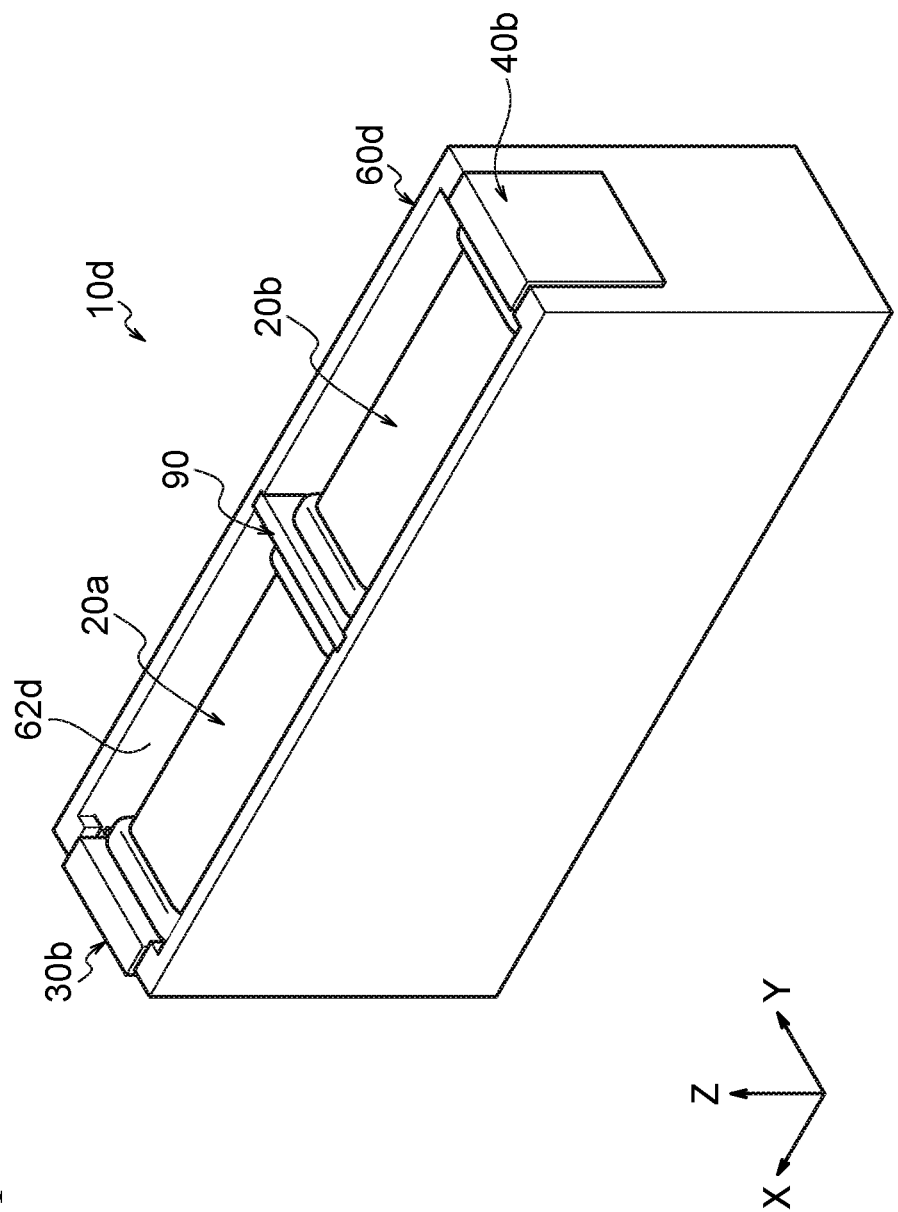
FIG. 14 is a schematic perspective view of an electronic device according to another embodiment of the present invention.
Figure 15A:
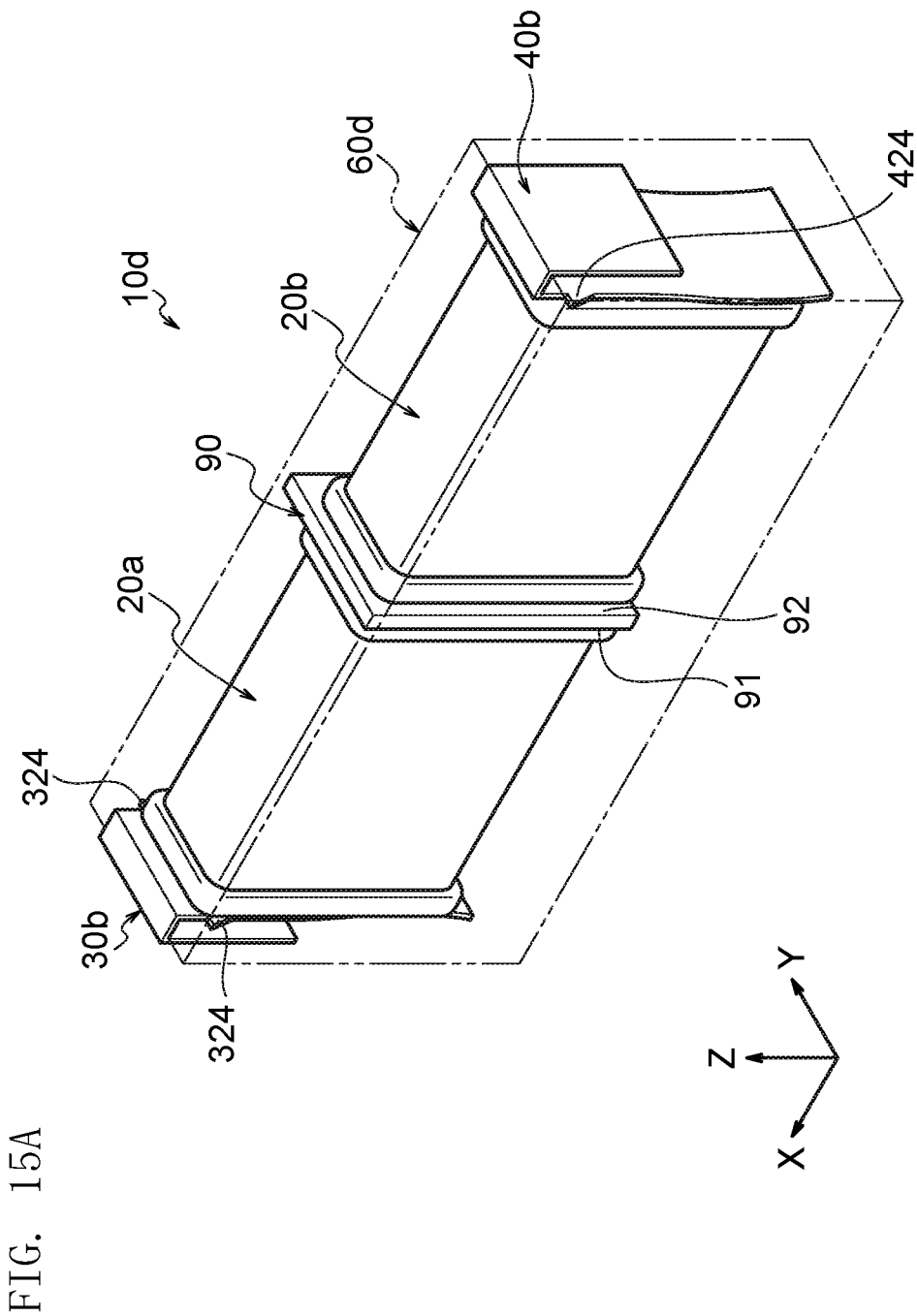
FIG. 15A is a schematic perspective view of the inside of the electronic device with a transparent case of FIG. 14.
Figure 15B:
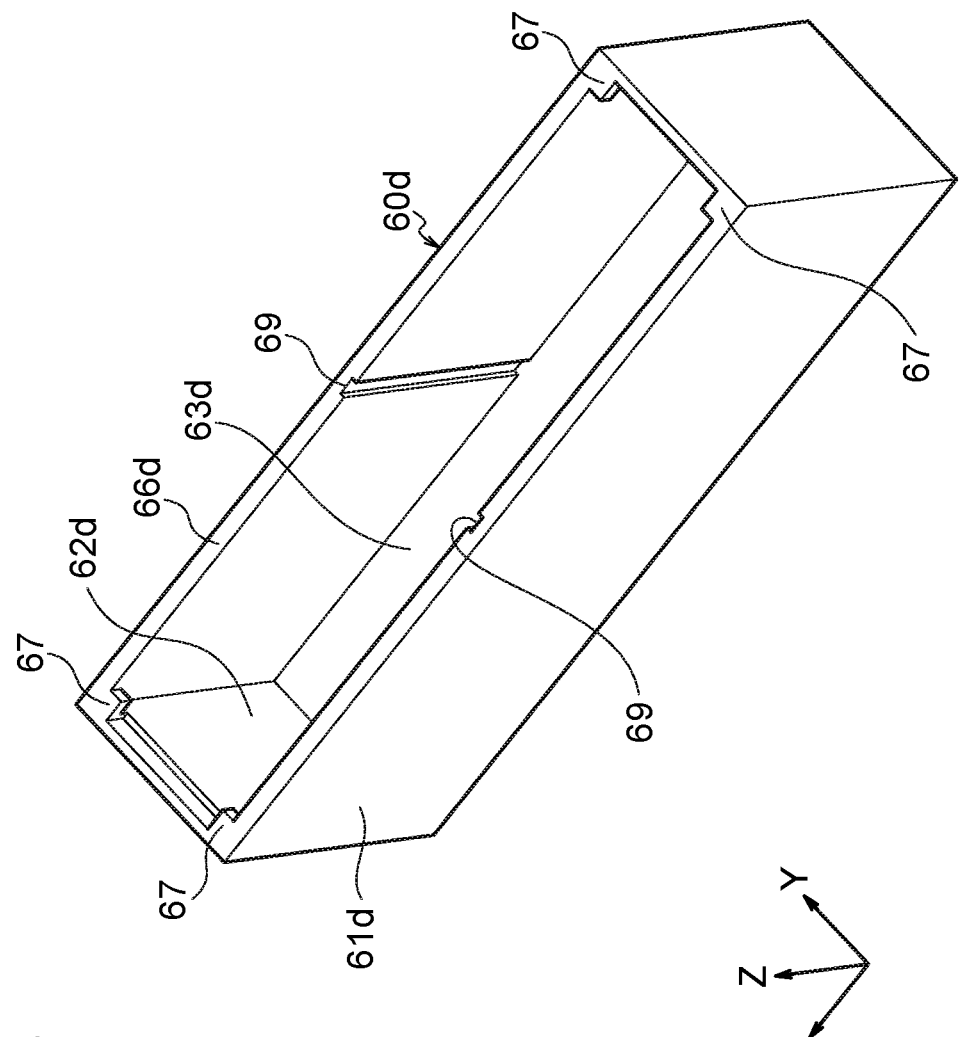
FIG. 15B is a schematic perspective view of the case shown in FIG. 14 viewed from a different angle.
Figure 16:
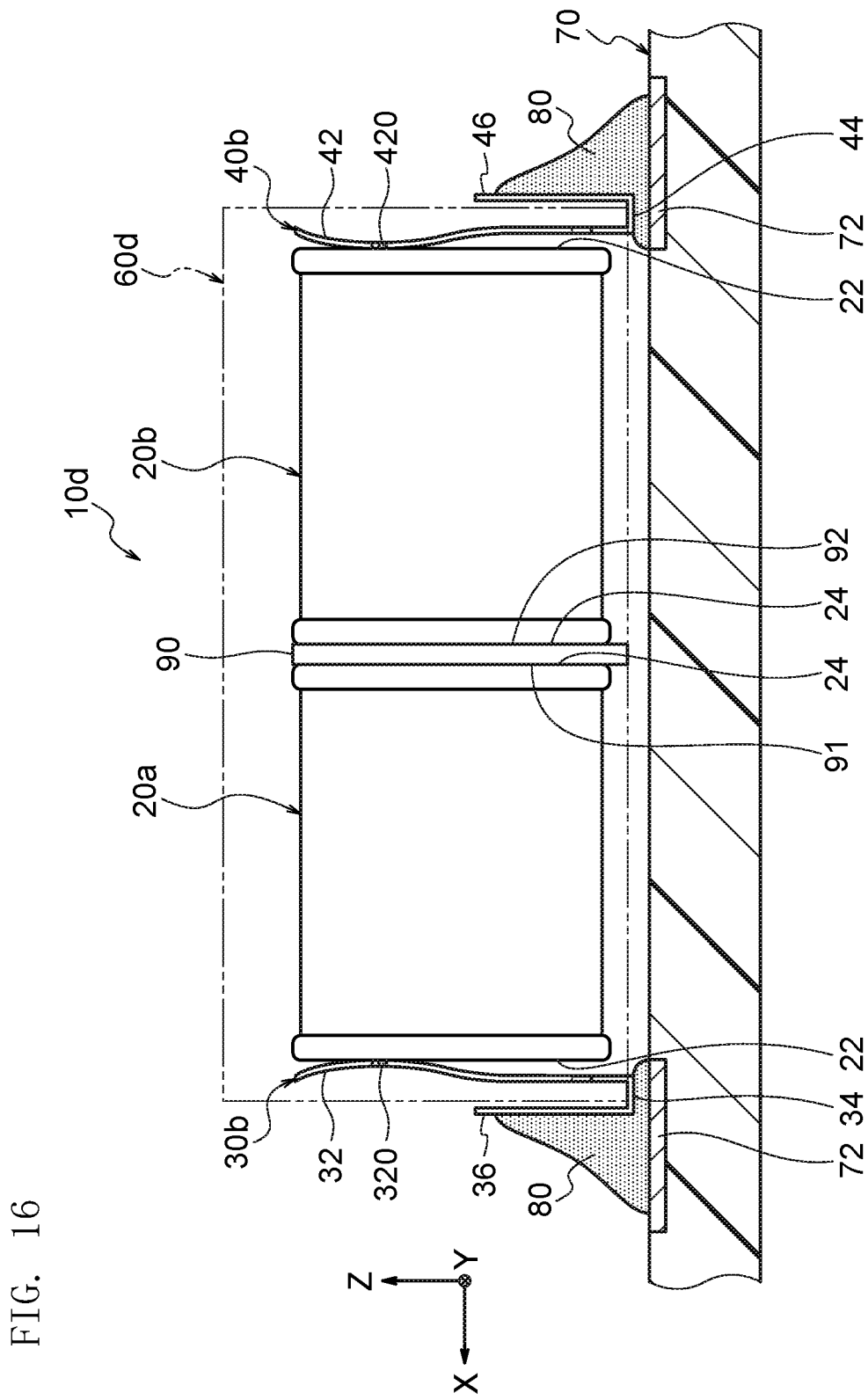
FIG. 16 is a partially transparent lateral view of a mounted state of the electronic device shown in FIG. 14.

Except for the following respects, an electronic device 10d according to the embodiment shown in FIG. 14 to FIG. 16 has similar structure and effects to those of the electronic device 10, 10a, 10b, or 10c according to the above-mentioned embodiment. In FIG. 14 to FIG. 16, members common with those of the electronic device 10, 10a, 10b, or 10c of the above-mentioned embodiment are given the same reference numerals and are not partly explained.

As shown in FIG. 14, the electronic device 10d according to the present embodiment includes an intermediate connector 90 and an insulating case 60d in addition to the capacitor chips 20a and 20b shown in FIG. 1, etc. and the individual metal terminals 30b and 40b shown in FIG. 8D, etc.

As shown in FIG. 15B, the insulating case 60d is formed by a rectangular parallelepiped housing elongated in the X-axis direction. In addition to the engagement protrusions 67 shown in FIG. 8B, the insulating case 60d includes an outer wall 61d, an accommodation recess 62d, a bottom wall 63d, an opening edge surface 66d, and engagement grooves 69. Each of the outer wall 61d, the bottom wall 63d, and the opening edge surface 66d has a shape that is further elongated in the X-axis direction compared to the outer wall 61, the bottom wall 63, and the opening edge surface 66 shown in FIG. 2B.

As shown in FIG. 15A and FIG. 15B, the outer wall 61d is provided with the individual metal terminals 30b and 40b. In the present embodiment, the individual metal terminals 30b and 40b are arranged to face each other in the X-axis direction (the longitudinal direction of the insulating case 60d).

The first individual metal terminal 30b is attached on a wall surface of the outer wall 61d parallel to the Y-Z plane located on one end in the X-axis direction. The second individual metal terminal 40b is attached on a wall surface of the outer wall 61d parallel to the Y-Z plane located on the other end in the X-axis direction. As shown in FIG. 16, the inner electrode parts 32 and 42 of the individual metal terminals 30b and 40b are provided with the curved parts 320 and 420, but the curved parts 320 and 420 are not essential components and may not be employed.

In the present embodiment, as shown in FIG. 15B, the insulating case 60d is not provided with the partition wall 64 shown in FIG. 2B. Thus, unlike the insulating case 60 shown in FIG. 2B, the number of accommodation recesses 62d included in the insulating case 60d is only one. When the intermediate connector 90 mentioned below is inserted into the accommodation recess 62d, two accommodation spaces arranged in the X-axis direction are formed inside the accommodation recess 62d.

The shape of the accommodation recess 62d corresponds to the overall shape of the insulating case 60d and is elongated in the X-axis direction. As shown in FIG. 15A and FIG. 16, the capacitor chips 20a and 20b are accommodated in the accommodation recess 62d.

In the present embodiment, the capacitor chips 20a and 20b are arranged between the first individual metal terminal 30b and the second individual metal terminal 40b while the end surfaces 21 and 23 face each other. That is, the capacitor chips 20a and 20b are arranged in series in the X-axis direction in the inside of the accommodation recess 62d.

The accommodation recess 62d is large enough to accommodate the capacitor chips 20a and 20b arranged in series. The width of the accommodation recess 62d in the X-axis direction (longitudinal direction) is larger than the sum of the widths of the capacitor chips 20a and 20b in the X-axis direction and is determined so that the terminal electrodes 22 and 24 of the capacitor chips 20a and 20b are contacted in pressure with the inner electrode parts 32 and 42 and the intermediate connector 50 while the terminals 30b and 40b and the intermediate connector 50 are attached to the insulating case 60d.

The engagement convexes 67 are formed at the respective corners (four corners) of the opening surface of the accommodation recess 62d. The engagement pieces 324 and 424 of the individual metal terminals 30b and 40b shown in FIG. 15A are engaged (fixed) with the respective engagement convexes 67.

As shown in FIG. 15B, two engagement grooves 69 extending in the Z-axis direction are formed on the inner wall surface (inner surface) of the outer wall 61d. Each of the engagement grooves 69 is formed inside a wall surface of the outer wall 61d parallel to the X-Z plane (a wall surface elongated in the X-axis direction) and is located in the middle of the wall surface in the longitudinal direction (a substantially central part in the X-axis direction).

The engagement grooves 69 are formed continuously from the upper end to the lower end of the outer wall 61d. The width of each of the engaging grooves 69 in the X-axis direction and the depth of each of the engaging grooves 69 in the Y-axis direction are large enough to insert and fix the intermediate connector 90. For example, the width of each of the engagement grooves 69 in the X-axis direction is approximately the same as or larger than the plate thickness of the intermediate connector 90.

As shown in FIG. 15A and FIG. 16, the intermediate connector 90 is formed of a conductive rectangular plate and is disposed between the pair of individual metal terminals 30b and 40b. The intermediate connector 90 and the pair of individual metal terminals 30b and 40b are arranged in the X-axis direction. The capacitor chips 20a and 20b are arranged on both sides of the intermediate connector 90 in the X-axis direction.

The intermediate connector 90 connects the terminal electrodes 24 and 24 of the capacitor chips 20a and 20b next to each other (arranged in series). That is, in the embodiment, the terminal electrodes 24 and 24 of the capacitor chips 20a and 20b are indirectly connected via the intermediate connector 90. The intermediate connector 90 is inserted into the accommodation recess 62d via the engagement grooves 69.

The intermediate connector 90 includes a first connection surface 91 facing one side in the X-axis direction and a second connection surface 92 facing the other side in the X-axis direction. The connection surfaces 91 and 92 are surfaces facing the lateral electrode parts 36 and 46 of the individual metal terminals 30b and 40b. The second terminal electrode 24 of the capacitor chip 20a is connected to the first connection surface 91, and the second terminal electrode 24 of the capacitor chip 20b is connected to the second connection surface 92. The capacitor chips 20a and 20b are electrically connected via the intermediate connector 90.

The area of the intermediate connector 90 (connection surfaces 91 and 92) is larger than that of the terminal electrodes 22 and 24 of the capacitor chips 20a and 20b, but is not limited. As long as the capacitor chips 20a and 20b are electrically connected to each other, the area of the intermediate connector 90 (connection surfaces 91 and 92) may be smaller than the illustrated one, and the shape of the intermediate connector 90 may be square, circle, triangle, or any other shapes.

The capacitor chip 20a is disposed in the space between the first individual metal terminal 30b and the intermediate connector 90 and is interposed by the first individual metal terminal 30b and the intermediate connector 90 while receiving a spring force from the curved part 320 of the first individual metal terminal 30b.

The capacitor chip 20b is disposed in the space between the second individual metal terminal 40b and the intermediate connector 90 and is interposed the second individual metal terminal 40b and the intermediate connector 90 while receiving a spring force from the curved part 420 of the second individual metal terminal 40b.

As shown in FIG. 16, the electronic device 10d is mounted on the individual circuit patterns 72 and 72 of the circuit board (external circuit) 70 in a state where the electronic device 10d shown in FIG. 14 is turned upside down. That is, the mounting surface of the electronic device 10d is on the opening surface side of the accommodation recess 62d shown in FIG. 15B. The electronic device 10d is mounted on the circuit board (external circuit) 70 by connecting the individual metal terminals 30 and 40 (the opening edge electrode parts 34 and 44 and the lateral electrode parts 36 and 46) and the individual circuit patterns 72 and 72 using the solder 80, a conductive adhesive, or the like.

Solder fillets are formed between the lateral electrode parts 36 and 46 and the individual circuit patterns 72 and 72, and the electronic device 10d can be firmly fixed to the circuit board (external circuit) 70.

As shown in FIG. 16, the electronic device 10d according to the present embodiment includes a pair of individual conductive terminals 30b and 40b arranged to face each other, and two capacitor chips 20a and 20b are interposed between the pair of individual conductive terminals 30b and 40b so that the end faces 24 and 24 face each other. Thus, the two capacitor chips 20a and 20b can be arranged in series in the accommodation recess 62d, and the electronic device 10d formed from the two capacitor chips 20a and 20b connected in series can be structured by connecting the terminal electrodes 24 and 24 of the capacitor chips 20a and 20b.

The electronic device 10d has an elongated shape in the X-axis direction and can thereby be mounted on a small (narrow) space of the circuit board (external circuit) 70.

In the present embodiment, the terminal electrodes 24 and 24 of the adjacent capacitor chips 20a and 20b can be easily connected to each other via the intermediate connector 90.

Incidentally, the present invention is not limited to the above-mentioned embodiments and can be variously modified within the scope of the invention.

In the above-mentioned embodiments, for example, the capacitor chip is illustrated as an example of the chip component, but a chip component other than the capacitor chip may be employed.

In the above-mentioned embodiments, the number of capacitor chips included in the electronic device is not limited to two or three and may be any other plural number.

In this case, the number of intermediate connectors 90 according to Fifth Embodiment is appropriately determined based on the number of capacitor chips included in the electronic device 10d. For example, the number of intermediate connectors 90 is two when the number of capacitor chips is three, and the three capacitor chips are connected in series via each of the two intermediate connectors 90.

In the above-mentioned embodiments, the curved parts 320, 420, and 520 are formed only on the inner electrode parts 32, 42, and 52 to be inserted along the inner wall surface on one side in the X-axis direction of the respective accommodation recesses 62a-62c, but the present invention is not limited thereto. For example, the curved parts 320, 420, and 520 may be formed on both of the inner electrode parts 32, 42, and 52 to be inserted into the inner wall surfaces on both sides in the X-axis direction of the respective accommodation recesses 62a-62c.

In the above-mentioned embodiments, the partition wall 64 constitutes a part of the insulation case 60 (60a, 60b), but another partition wall member (a member that functions similarly to the partition wall 64) may be prepared and disposed at a position corresponding to the partition wall 64 of the insulating case 60 (60a, 60b). That is, an insulating partition wall may be configured separately from the insulating case.

In Fifth Embodiment, the intermediate connector 90 is not an essential component. For example, the terminal electrodes 24 and 24 of the capacitor chips 20a and 20b may be directly connected to each other in the accommodation recess 62d without the intermediate connector 90. Alternatively, the terminal electrodes 24 and 24 of the capacitor chips 20a and 20b may be connected to each other using a conductive adhesive or so.

DESCRIPTION OF THE REFERENCE NUMERICAL 10, 10a-10d . . . electronic device
20a-20c . . . capacitor chip
  21, 23 . . . end surface
  22, 24 . . . terminal electrode
  26 . . . internal electrode layer
  28 . . . dielectric layer
30, 30a-30c . . . first individual metal terminal (individual conductive terminal)
  32 . . . inner electrode part
  320 . . . curved part
  321 . . . base part
  322 . . . through hole
  323 . . . continuous boundary part
  324 . . . engagement piece
  34 . . . opening edge electrode part
  36 . . . lateral electrode part
  38 . . . anti-opening electrode part
40, 40a-40c . . . second individual metal terminal (individual conductive terminal)
  42 . . . inner electrode part
  420 . . . curved part
  421 . . . base part
  422 . . . through hole
  423 . . . continuous boundary part
  424 . . . engagement piece
  44 . . . opening edge electrode part
  46 . . . lateral electrode part
  48 . . . anti-opening electrode part
50, 50a-50d . . . common metal terminal (common conductive terminal)
  52 . . . inner electrode part
  520 . . . curved part
  521 . . . base part
  523 . . . continuous boundary part
  524 . . . engagement piece
  525 . . . communication piece
  53 . . . slit
  54 . . . opening edge electrode part
  56 . . . lateral electrode part
  58 . . . anti-opening electrode part
60, 60a, 60b, 60d . . . insulating case
  61, 61d . . . outer wall
  62a, 62b, 62d . . . accommodation recess
  63, 63d . . . bottom wall
  64 . . . partition wall
  65 . . . communication groove
  66, 66d . . . opening edge surface
  67 . . . engagement convex
  68 . . . anti-opening surface (bottom surface)
70 . . . circuit board
  72, 72a . . . individual circuit pattern
  74 . . . common circuit pattern
80 . . . solder
90 . . . intermediate connector
  91 . . . first connection surface
  92 . . . second connection surface

What is claimed is:

1. A conductive terminal comprising:
an inner electrode part connectable to a terminal electrode of a chip component by being inserted along an inner wall of an accommodation recess of a case for accommodating the chip component on which the terminal electrode is formed;
an opening edge electrode part formed continuously to the inner electrode part along an opening edge surface of the case; and
a lateral electrode part formed continuously to the opening edge electrode part along an outer surface of the case, wherein
the inner electrode part comprises:
  a base part having a flat plate shape and continuing to the opening edge electrode part;
  a curved part formed near a tip of the base part and protruding away from the lateral electrode part, and
  a continuous boundary part formed in a boundary part between the base part and the curved part and continuously connecting the base part and the curved part,
a first radius of curvature (R1) of the continuous boundary part is 0.5-15 mm,
a height (h) from an inner surface of the base part to a maximum protrusion position of the curved part is 0.48-0.6 mm, and
the inner electrode part has a length (z) of 4.0-6.0 mm.

2. The conductive terminal according to claim 1, wherein the first radius of curvature (R1) is 3.0-10 mm.

3. The conductive terminal according to claim 2, wherein the curved part is curved on the other side of a curve by the first radius of curvature (R1), and
a second radius of curvature (R2) of the curved part is 1.0-6.0 mm.

4. The conductive terminal according to claim 3, wherein the second radius of curvature (R2) is 2.0-5.0 mm.

5. The conductive terminal according to claim 1, wherein the curved part is curved on the other side of a curve by the first radius of curvature (R1), and
a second radius of curvature (R2) of the curved part is 1.0-6.0 mm.

6. The conductive terminal according to claim 5, wherein the second radius of curvature (R2) is 2.0-5.0 mm.

7. The conductive terminal according to claim 1, wherein a thickness (t) of the inner electrode part is 0.05-0.35 mm, and
a width (w) of the inner electrode part is 1.8-2.5 mm.

8. The conductive terminal according to claim 7, wherein the thickness (t) of the inner electrode part is 0.1-0.35 mm.

9. The conductive terminal according to claim 1, wherein a through hole is formed in the base part of the inner electrode part.

10. The conductive terminal according to claim 1, wherein an engagement piece protruding outward in a width direction is formed with the base part of the inner electrode part.

11. The conductive terminal according to claim 1, wherein a surface of the inner electrode part is subjected to a solder adhesion prevention treatment.

12. An electronic device comprising:
the conductive terminal according to claim 1,
the chip component on which the terminal electrode is formed, and
the case having the accommodation recess for accommodating the chip component and the opening edge surface along the opening surface of the accommodation recess.

13. An electronic device comprising:
a conductive terminal;
a chip component on which a terminal electrode is formed; and
a case having an accommodation recess for accommodating the chip component and an opening edge surface along an opening surface of the accommodation recess, wherein
the conductive terminal comprises:
  an inner electrode part connectable to the terminal electrode by being inserted along an inner wall of the accommodation recess of the case for accommodating the chip component on which the terminal electrode is formed;
  an opening edge electrode part formed continuously to the inner electrode part along an opening edge surface of the case; and
  a lateral electrode part formed continuously to the opening edge electrode part along an outer surface of the case,
the inner electrode part comprises:
  a base part having a flat plate shape and continuing to the opening edge electrode part;
  a curved part formed near a tip of the base part and protruding away from the lateral electrode part; and
  a continuous boundary part formed in a boundary part between the base part and the curved part and continuously connecting the base part and the curved part, and
the inner electrode part and the terminal electrode of the chip component are connected in a pressure contact state only by a spring force of the curved part.

14. A conductive terminal comprising:
an inner electrode part connectable to a terminal electrode of a chip component by being inserted along an inner wall of an accommodation recess of a case for accommodating the chip component on which the terminal electrode is formed;
an opening edge electrode part formed continuously to the inner electrode part along an opening edge surface of the case; and
a lateral electrode part formed continuously to the opening edge electrode part along an outer surface of the case, wherein
the inner electrode part comprises:
  a base part having a flat plate shape and continuing to the opening edge electrode part;
  a curved part formed near a tip of the base part and protruding away from the lateral electrode part, and
  a continuous boundary part formed in a boundary part between the base part and the curved part and continuously connecting the base part and the curved part, and
a first radius of curvature (R1) of the continuous boundary part is 0.5-15 mm.

* * * * *